(12) United States Patent
Tsuchiya et al.

(10) Patent No.: US 12,396,354 B2
(45) Date of Patent: Aug. 19, 2025

(54) DISPLAY DEVICE

(71) Applicant: Sharp Display Technology Corporation, Kameyama (JP)

(72) Inventors: Hiroshi Tsuchiya, Kameyama (JP); Takashi Satoh, Kameyama (JP)

(73) Assignee: Sharp Display Technology Corporation, Kameyama (JP)

( * ) Notice: Subject to any disclaimer, the term of this patent is extended or adjusted under 35 U.S.C. 154(b) by 0 days.

(21) Appl. No.: 18/794,409

(22) Filed: Aug. 5, 2024

(65) Prior Publication Data

US 2025/0081800 A1    Mar. 6, 2025

(30) Foreign Application Priority Data

Aug. 30, 2023  (JP) .................. 2023-139767

(51) Int. Cl.
   *H10K 59/50*   (2023.01)
   *G02F 1/1335*  (2006.01)
   *G02F 1/1337*  (2006.01)
   *G02F 1/139*   (2006.01)
   *H10K 59/131*  (2023.01)

(52) U.S. Cl.
   CPC ....... *H10K 59/50* (2023.02); *G02F 1/133553* (2013.01); *G02F 1/133746* (2021.01); *G02F 1/133749* (2021.01); *G02F 1/133769* (2021.01); *G02F 1/1391* (2013.01); *G02F 1/1397* (2013.01); *H10K 59/131* (2023.02); *G02F 2201/123* (2013.01)

(58) Field of Classification Search
   CPC ............. H10K 59/50; H10K 59/131; G02F 1/133553; G02F 1/133746; G02F 1/133749; G02F 1/133769; G02F 1/1391; G02F 1/1397; G02F 2201/123; G02F 1/133616

See application file for complete search history.

(56) References Cited

U.S. PATENT DOCUMENTS

| | | | |
|---|---|---|---|
| 10,547,026 B2 | 1/2020 | Narutaki et al. | |
| 2003/0128314 A1 | 7/2003 | Dozov et al. | |
| 2005/0248705 A1 | 11/2005 | Smith et al. | |
| 2013/0194528 A1* | 8/2013 | Wang | H05B 33/14 313/504 |

FOREIGN PATENT DOCUMENTS

| | | |
|---|---|---|
| JP | 4530217 B2 | 8/2010 |
| JP | 4942898 B2 | 5/2012 |

* cited by examiner

*Primary Examiner* — Donald L Raleigh
(74) *Attorney, Agent, or Firm* — ScienBiziP, P.C.

(57) ABSTRACT

A display device includes: a plurality of pixels arranged in a matrix in a display area, wherein each of the plurality of pixels includes a reflective liquid crystal portion and a self-luminous element portion, in the reflective liquid crystal portion, a first substrate does not include a switching element, a reflector, a pixel electrode, a liquid crystal layer, and an opposite electrode form a reflective liquid crystal display element that operates in bistable liquid crystal display mode, in the self-luminous element portion, the first substrate includes: a switching element; a self-luminous display element including a first electrode, an organic layer, and a second electrode; and a coating layer disposed on a side of the liquid crystal layer of the self-luminous display element, and the coating layer is provided contiguously across the reflective liquid crystal portion and the self-luminous element portion.

15 Claims, 14 Drawing Sheets

DISPLAY DEVICE

FIELD OF THE INVENTION

The present disclosure relates to display devices.

BACKGROUND OF THE INVENTION

Various display devices such as liquid crystal display devices and organic electroluminescence (EL) display devices have been used in many applications to display videos (moving images and still images).

For instance, the liquid crystal display device is a display device that utilizes a liquid crystal composition to produce a display and in typical display techniques includes: a TFT substrate including thin film transistors (TFTs); an opposite substrate disposed opposite the TFT substrate; and a liquid crystal layer enclosed between the TFT substrate and the opposite substrate.

Liquid crystal display devices are roughly divided into reflective types and transmissive types, depending on the technique by which light is transmitted to the liquid crystal layer. The reflective liquid crystal display device includes a reflector inside the device and produces a display by reflecting incoming external incident light off the reflector so that the reflected light can be transmitted by the liquid crystal layer. The transmissive liquid crystal display device produces a display by a backlight unit, disposed on the rear side of the liquid crystal display device, outputting light that is transmitted by the liquid crystal layer. The reflective liquid crystal display device needs no backlight unit and therefore can achieve low power consumption, small thickness, and lightweight. In contrast, the transmissive liquid crystal display device includes a light source on the rear side of the device and therefore provides good visibility even in a dark environment.

In addition, the organic EL display device is a self-luminous display device and includes, for example: a TFT substrate including TFTs; organic EL elements disposed on the TFT substrate and connected to the TFTs; and a sealing substrate disposed so as to cover the organic EL elements. Organic EL display devices for full-color display typically include three-color (red (R), green (G), and blue (B)) organic EL elements as subpixels. These subpixels are arranged in a matrix, and each set of three-color subpixels form a single pixel. Images are displayed by selectively causing these organic EL elements to emit light at desirable luminance.

For example, as a technology related to a display device, Patent Literature 1 discloses, a display device including: a TFT substrate including drive elements and an insulating layer on the drive elements; a liquid crystal layer containing a liquid crystal composition; an opposite substrate including a transparent electrode, opposite the TFT substrate via the liquid crystal layer; and a polarizer provided on a surface of the opposite substrate opposite a surface of the opposite substrate facing the liquid crystal layer, wherein the display device includes, in a display area, a plurality of pixels each including a first region and a second region adjacent to each other, the first region includes a reflective electrode above the insulating layer of the TFT substrate, the second region includes a light-emitting element including a stack of a first electrode, an organic layer, and a second electrode on the insulating layer of the TFT substrate, the light-emitting elements includes a coating layer covering an entire light-emitting region of the individual pixels, and the coating layer has an edge thereof affixed to the insulating layer. As other examples, Patent Literature 2 and Patent Literature 3 also disclose a technology related to a display device.

CITATION LIST

Patent Literature

Patent Literature 1: U.S. Pat. No. 10,547,026
Patent Literature 2: Japanese Patent No. 4530217
Patent Literature 3: Japanese Patent No. 4942898

SUMMARY OF THE INVENTION

Problems to Be Solved by the Invention

FIG. 21 is a schematic cross-sectional view of a pixel in the display device of Patent Literature 1. Patent Literature 1 listed above discloses a hybrid display device that is a combination of reflective liquid crystal display elements and self-luminous display elements. Referring to FIG. 21, a display device 1R for hybrid display technique of Patent Literature 1 includes a reflective liquid crystal display element 20R and a self-luminous display element 30R in each pixel 1PR, to improve outdoor visibility under direct sunlight and indoor and nighttime visibility.

More specifically, the display device 1R includes: a first substrate 100R including an insulating film 105R on thin film transistors (TFTs) as drive elements (switching elements) (specifically, current supply TFTs 12R and switching TFTs 13R); a liquid crystal layer 22R containing liquid crystal molecules 22AR; a second substrate 200R including an opposite electrode 23R and disposed opposite the first substrate 100R via the liquid crystal layer 22R; and a circular polarizer 25R provided on a surface of the second substrate 200R opposite a surface of the second substrate 200R facing the liquid crystal layer 22R.

The display device 1R includes a plurality of pixels 1PR each including a reflective liquid crystal portion 1AR and a self-luminous element portion 1BR disposed adjacent to each other in the display area.

In the reflective liquid crystal portion 1AR, the first substrate 100R includes: a first support substrate 101R; a source electrode 13SR, a semiconductor layer 102AR, and a drain electrode 13DR; a gate insulating film 103R; a gate electrode 13GR; an inorganic insulating film 104R; the insulating film 105R; a liquid-crystal-element-side insulating film 32aR; and a reflective electrode 21R, which are stacked in the stated order toward the liquid crystal layer 22R side. The source electrode 13SR, the gate electrode 13GR, the drain electrode 13DR, and the semiconductor layer 102AR form the switching TFT 13R. The reflective electrode 21R, the liquid crystal layer 22R, the opposite electrode 23R, and the circular polarizer 25R provided in the reflective liquid crystal portion 1AR form the reflective liquid crystal display element 20R.

In the self-luminous element portion 1BR, the first substrate 100R includes: the first support substrate 101R; a source electrode 12SR, a semiconductor layer 102BR, and a drain electrode 12DR; the gate insulating film 103R; a gate electrode 12GR; the inorganic insulating film 104R; the insulating film 105R; a first electrode 31R; a self-luminous-element-side insulating film 32R; an organic layer 33R; a second electrode 34R; and a coating layer 35R, which are stacked in the stated order toward the liquid crystal layer 22R side. The source electrode 12SR, the gate electrode 12GR, the drain electrode 12DR, and the semiconductor layer 102BR form the current supply TFT 12R. The first electrode 31R, the organic layer 33R, and the second electrode 34R form the self-luminous display element 30R. The coating layer 35R covers the entire self-luminous display element 30R for each pixel 1PR and may be referred to as a sealing layer.

The self-luminous-element-side insulating film 32R is an insulating film that is often referred to as an insulating bank for delimiting light-emitting regions. The self-luminous-element-side insulating film 32R is provided also on the insulating film 105R of the reflective liquid crystal portion 1AR and is made of the same material and with generally the same thickness. The self-luminous-element-side insulating film 32R in the reflective liquid crystal portion 1AR, since being separated from the self-luminous-element-side insulating film 32R, which is a so-called insulating bank, of the self-luminous element portion 1BR, is referred to as the liquid-crystal-element-side insulating film 32aR.

The second substrate 200R including a second support substrate 201R, a color filter layer 24R, and the opposite electrode 23R, which are stacked in the stated order toward the liquid crystal layer 22R side.

The reflective liquid crystal display element 20R has either a TFT drive structure or a memory-in-pixel (MIP) structure. Either the switching TFT 13R or a memory circuit, provided in the same layer as the drive circuit (current supply TFT 12R) disposed in the self-luminous element portion 1BR, needs to be connected to the reflective electrode 21R.

In the display device 1R, to connect the reflective electrode 21R and the switching TFT 13R provided in the reflective liquid crystal portion 1AR, the coating layer 35R is not provided in the reflective liquid crystal portion 1AR, only the self-luminous display element 30R needs to be sealed by the coating layer 35R, and in the reflective liquid crystal portion 1AR, there needs to be provided a contact hole 11CHR in the liquid-crystal-element-side insulating film 32aR disposed in a lower part of the reflective electrode 21R. In so doing, since the coating layer 35R is formed in an insular shape, a boundary is formed in the coating layer 35R in each pixel 1PR, and, for example, moisture may penetrate through this boundary, which could degrade the self-luminous display element 30R. As described here, in the display device 1R, the self-luminous display element 30R is not sufficiently sealed and may have a short lifespan.

The present invention, made in view of these issues, has an object to provide a display device that includes a reflective liquid crystal display element and a self-luminous display element in each pixel and that restrains degradation of the self-luminous display element.

Solution to the Problems (1) The present invention, in an embodiment thereof, is directed to a display device including: a first substrate including a switching element; a liquid crystal layer containing liquid crystal molecules; and a second substrate including an opposite electrode, all of which are provided sequentially, the display device further including a plurality of pixels arranged in a matrix in a display area, wherein each of the plurality of pixels includes a reflective liquid crystal portion and a self-luminous element portion, in the reflective liquid crystal portion, the first substrate includes a reflector, a coating layer, and a pixel electrode, which are provided sequentially toward a liquid crystal layer side, but does not include a switching element, the reflector, the pixel electrode, the liquid crystal layer, and the opposite electrode form a reflective liquid crystal display element that operates in bistable liquid crystal display mode, in the self-luminous element portion, the first substrate includes: the switching element; a self-luminous display element including a first electrode, an organic layer, and a second electrode; and the coating layer disposed on a liquid crystal layer side of the self-luminous display element, and the coating layer is provided contiguously across the reflective liquid crystal portion and the self-luminous element portion.

(2) The present invention, in another embodiment thereof, is directed to a display device of (1) described above that is further configured so as to further include: a non-display area provided around the display area; and a wire provided in the non-display area of the first substrate, wherein in the non-display area, the opposite electrode is connected to the wire, and the pixel electrode is connected to the wire.

(3) The present invention, in another embodiment thereof, is directed to a display device of (1) or (2) described above that is further configured such that the liquid crystal layer assumes either one of a first stable state and a second stable state in which the liquid crystal molecules assume different alignment states in absence of applied voltage where a voltage that is lower than a threshold value is applied across the pixel electrode and the opposite electrode, and the liquid crystal molecules are switched between the first stable state and the second stable state by applying a pulsed voltage across the pixel electrode and the opposite electrode.

(4) The present invention, in another embodiment thereof, is directed to a display device of (1), (2), or (3) described above that is further configured such that the coating layer is provided contiguously across the plurality of pixels.

(5) The present invention, in another embodiment thereof, is directed to a display device of (1), (2), (3), or (4) described above that is further configured such that the reflector is disposed in a same layer as the first electrode.

(6) The present invention, in another embodiment thereof, is directed to a display device of (1), (2), (3), (4), or (5) described above that is further configured so as to further include: a vertical alignment film disposed between the first substrate and the liquid crystal layer; and a grating layer disposed between the second substrate and the liquid crystal layer, wherein the liquid crystal layer assumes either one of a first stable state in which the liquid crystal molecules assume a vertical alignment and a second stable state in which the liquid crystal molecules assume an HAN alignment in absence of applied voltage where a voltage that is lower than a threshold value is applied across the pixel electrode and the opposite electrode, and the liquid crystal molecules are switched between the first stable state and the second stable state by applying a pulsed voltage across the pixel electrode and the opposite electrode.

(7) The present invention, in another embodiment thereof, is directed to a display device of (6) described above that is further configured such that in the first stable state, the liquid crystal molecules have a pretilt angle of from 85° to 90°, both inclusive, on a first substrate side and a pretilt angle of from 85° to 90°, both inclusive, on a second substrate side.

(8) The present invention, in another embodiment thereof, is directed to a display device of, (6) or (7) described above that is further configured such that in the second stable state, the liquid crystal molecules have a pretilt angle of from 85° to 90°, both inclusive, on a first substrate side and a pretilt angle of from 0° to 5°, both inclusive, on a second substrate side.

(9) The present invention, in another embodiment thereof, is directed to a display device of (1), (2), (3), (4), or (5) described above that is further configured so as to further include: a pretilted horizontal alignment film disposed between the first substrate and the liquid crystal layer; and a grating layer disposed between the second substrate and the liquid crystal layer, wherein the liquid crystal layer assumes either one of a first stable state in which the liquid crystal molecules assume a TN alignment and a second stable state in which the liquid crystal molecules assume an HAN alignment in absence of applied voltage where a voltage that is lower than a threshold value is applied across the pixel electrode and the opposite electrode, and the liquid crystal molecules are switched between the first stable state and the second stable state by applying a pulsed voltage across the pixel electrode and the opposite electrode.

(10) The present invention, in another embodiment thereof, is directed to a display device of (9) described above that is further configured such that in the first stable state, the liquid crystal molecules have a pretilt angle of from 3° to 5°, both inclusive, on a first substrate side and a pretilt angle of from 0° to 5°, both inclusive, on a second substrate side, and an alignment direction of the liquid crystal molecules on the first substrate side and an alignment direction of the liquid crystal molecules on the second substrate side make an angle of from 80° to 90°, both inclusive, in a plan view.

(11) The present invention, in another embodiment thereof, is directed to a display device of (9) or (10) described above that is further configured such that in the second stable state, the liquid crystal molecules have a pretilt angle of from 3° to 5°, both inclusive, on a first substrate side and a pretilt angle of from 85° to 90°, both inclusive, on a second substrate side.

(12) The present invention, in another embodiment thereof, is directed to a display device of (1), (2), (3), (4), or (5) described above that is further configured so as to further include: a weak anchoring alignment film disposed between the first substrate and the liquid crystal layer; and a strong anchoring alignment film disposed between the second substrate and the liquid crystal layer, wherein the liquid crystal layer assumes either one of a first stable state in which the liquid crystal molecules assume a homogeneous alignment and a second stable state in which the liquid crystal molecules on a first substrate side assume a twisted alignment in which these liquid crystal molecules are twisted by 180° from the first stable state in a plan view, in absence of applied voltage where a voltage that is lower than a threshold value is applied across the pixel electrode and the opposite electrode, and the liquid crystal molecules are switched between the first stable state and the second stable state by applying a pulsed voltage across the pixel electrode and the opposite electrode.

(13) The present invention, in another embodiment thereof, is directed to a display device of (12) described above that is further configured such that in the first stable state, the liquid crystal molecules have a pretilt angle of from 0° to 5°, both inclusive, on the first substrate side and a pretilt angle of from 5° to 10°, both inclusive, on a second substrate side, and an alignment direction of the liquid crystal molecules on the first substrate side and an alignment direction of the liquid crystal molecules on the second substrate side make an angle of from 0° to 10°, both inclusive, in a plan view.

(14) The present invention, in another embodiment thereof, is directed to a display device of (12) or (13) described above that is further configured such that in the second stable state, the liquid crystal molecules have a pretilt angle of from 0° to 5°, both inclusive, on the first substrate side and a pretilt angle of from 5° to 10°, both inclusive, on a second substrate side, an alignment direction of the liquid crystal molecules on the first substrate side and an alignment direction of the liquid crystal molecules on the second substrate side make an angle of from 0° to 10°, both inclusive, in a plan view, and the liquid crystal molecules are aligned twisted in-plane by from 170° to 180°, both inclusive, from the first substrate side toward the second substrate side.

(15) The present invention, in another embodiment thereof, is directed to a display device of (1), (2), (3), (4), (5), (6), (7), (8), (9), (10), (11), (12), (13) or (14) described above that is further configured such that the reflector has projections and depressions on a surface of the reflector on the liquid crystal layer side.

Advantageous Effects of the Invention

The present invention can provide a display device that includes a reflective liquid crystal display element and a self-luminous display element in each pixel and that restrains degradation of the self-luminous display element.

DESCRIPTION OF EMBODIMENTS

Figure 1:
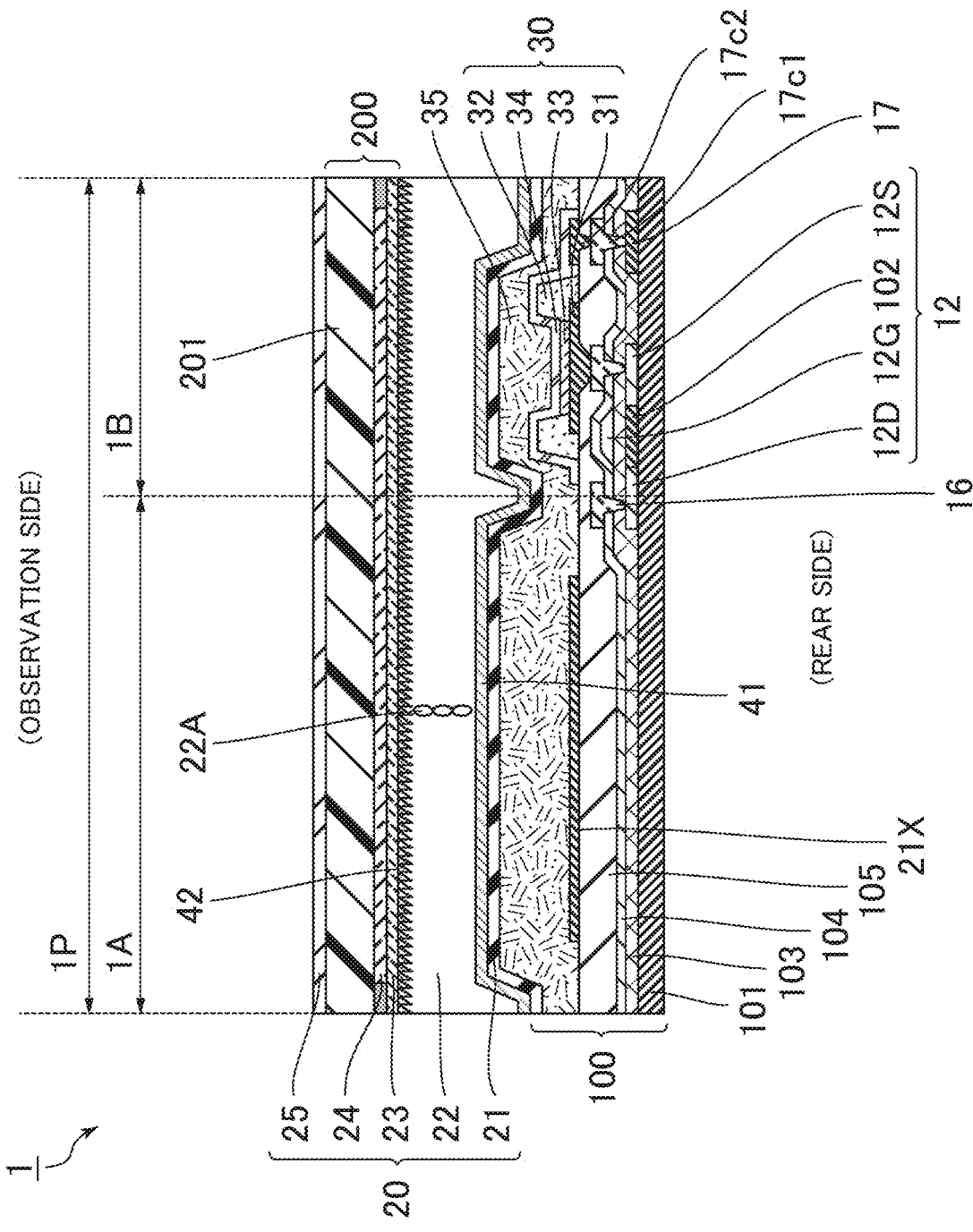
FIG. 1 is a schematic cross-sectional view of a pixel in a display device in accordance with Embodiment 1.

The following will describe embodiments of the present invention. The present invention is not limited to the content of the description of the following embodiments and may be appropriately changed in design without departing from the technical concept of the present invention. Note that throughout the following description, identical members and those having similar functions are indicated by the same reference numerals in different drawings where appropriate, and description of such members may not be repeated. Various embodiments of the present invention may be combined in a suitable manner without departing from its spirit of the present invention.

Embodiment 1

Figure 2A:
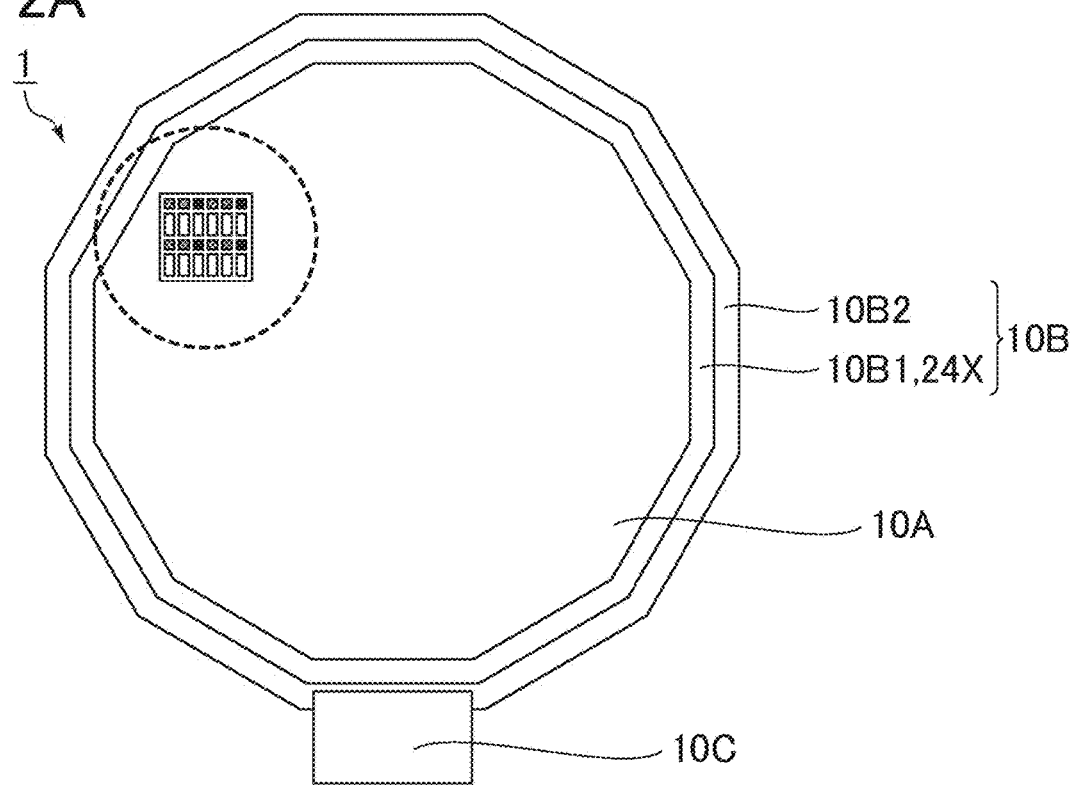
FIG. 2A is a schematic plan view of the display device in accordance with Embodiment 1.
Figure 2B:
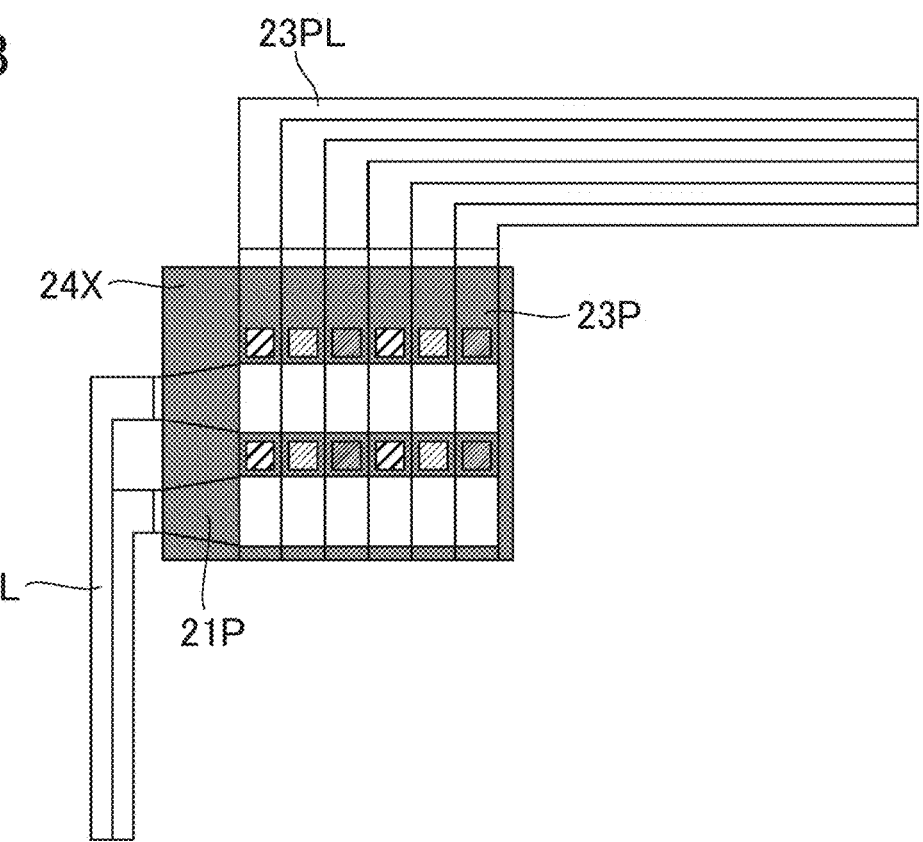
FIG. 2B is a schematic enlarged plan view of a region surrounded by a broken line shown in FIG. 2A.
Figure 3:
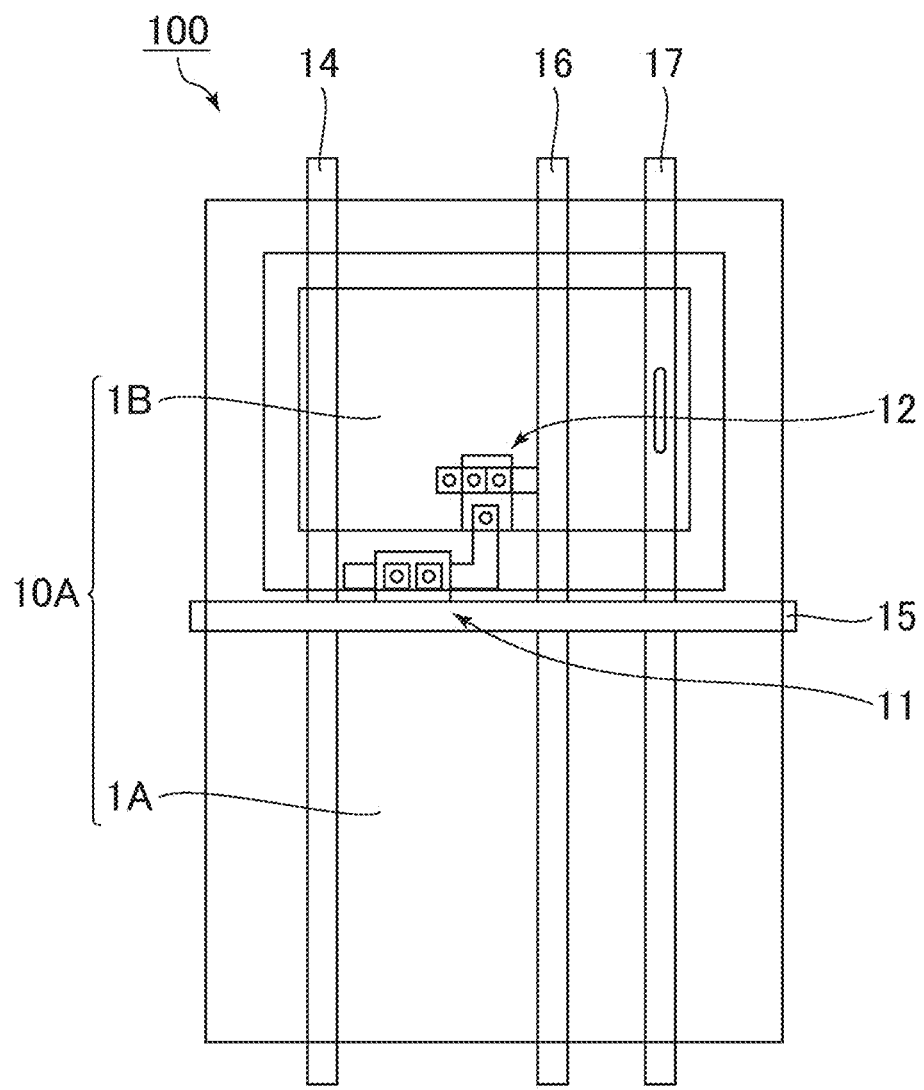
FIG. 3 is an equivalent circuit diagram of, for example, a TFT and wires disposed on a first substrate shown in FIG. 1.

FIG. 1 is a schematic cross-sectional view of a pixel in a display device in accordance with Embodiment 1. FIG. 2A is a schematic plan view of the display device in accordance with Embodiment 1. FIG. 2B is a schematic enlarged plan view of a region surrounded by a broken line shown in FIG. 2A. FIG. 3 is an equivalent circuit diagram of, for example, a TFT and wires disposed on a first substrate shown in FIG. 1.

Referring to FIGS. 1 to 3, a display device 1 in accordance with the present embodiment includes: a first substrate 100 including switching elements; a liquid crystal layer 22 containing liquid crystal molecules 22A; and a second substrate 200 including an opposite electrode 23, which are stacked in the stated order. The display device 1 includes a plurality of pixels 1P arranged in a matrix in a display area 10A. Each pixel 1P includes a reflective liquid crystal portion 1A and a self-luminous element portion 1B. In the reflective liquid crystal portion 1A, the first substrate 100 includes a reflector 21X, a coating layer 35, and a pixel electrode 21, which are stacked in the stated order toward the liquid crystal layer 22 side, and includes no switching elements. The reflector 21X, the pixel electrode 21, the liquid crystal layer 22, and the opposite electrode 23 form a reflective liquid crystal display element 20 that operates in bistable liquid crystal display mode. In the self-luminous element portion 1B, the first substrate 100 includes: current-supply thin film transistors (TFTs) 12 as the switching elements; self-luminous display elements 30 each including a first electrode 31, an organic layer 33, and a second electrode 34; and the coating layer 35 disposed on the liquid crystal layer 22 side of the self-luminous display element 30. The coating layer 35 is provided contiguously across the reflective liquid crystal portion 1A and the self-luminous element portion 1B.

The reflector 21X, the pixel electrode 21, the liquid crystal layer 22, and the opposite electrode 23, disposed in the reflective liquid crystal portion 1A, form the reflective liquid crystal display element 20 that operates in bistable liquid crystal display mode. The self-luminous display element 30 is disposed in the self-luminous element portion 1B. As described here, the display device 1 in accordance with the present embodiment is a hybrid display device that is a combination of the reflective liquid crystal display elements 20 and the self-luminous display elements 30 and enables improving outdoor visibility under direct sunlight and indoor and nighttime visibility.

Figure 21:
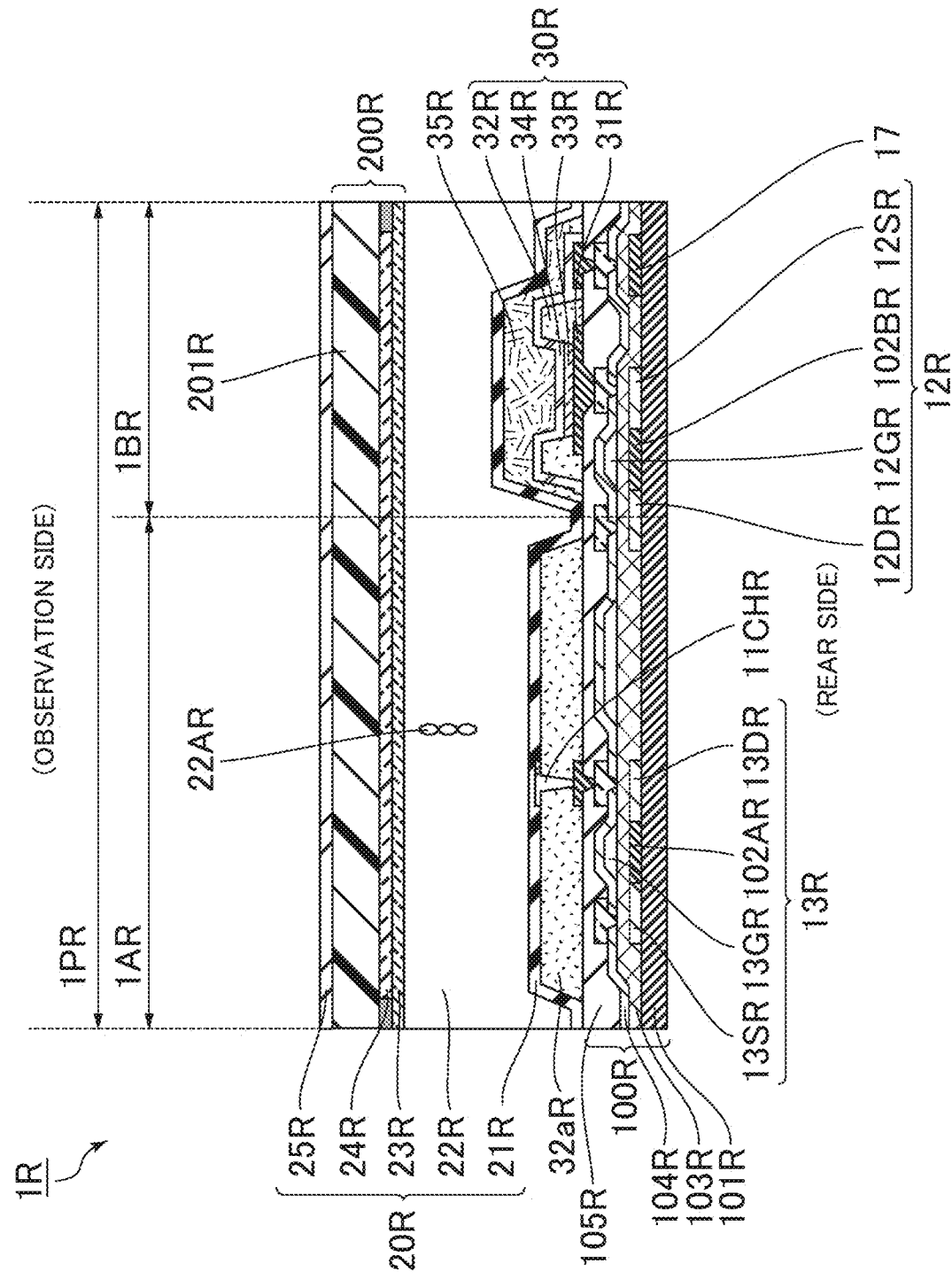
FIG. 21 a schematic cross-sectional view of a pixel in a display device in accordance with Patent Literature 1.

Here, as shown in FIG. 21, in Patent Literature 1 described above, the reflective liquid crystal display element 20R disposed in the reflective liquid crystal portion 1AR is an active matrix drive type, and to connect the reflective electrode 21R and the switching TFT 13R in the reflective liquid crystal portion 1AR, the coating layer 35R is not provided in the reflective liquid crystal portion 1AR and needs to be provided insularly only in the self-luminous element portion 1BR where the self-luminous display element 30R is disposed. As a result, a boundary is formed between the insulating film 105R and the coating layer 35R in each pixel 1PR, and, for example, moisture may penetrate through this boundary, which could degrade the self-luminous display element 30R.

In contrast, in the present embodiment, the reflective liquid crystal display element 20 operates in bistable liquid crystal display mode and therefore can be passively driven irrespective of resolution, which eliminates the need for active elements (switching elements) such as TFTs. In the display device 1 in accordance with the present embodiment, there is no need to provide TFTs in the reflective liquid crystal portion 1A where the reflective liquid crystal display elements 20 are provided. Therefore, there is no need to connect the pixel electrodes to the TFTs in the reflective liquid crystal portion as in Patent Literature 1 described above. The coating layer 35 can be hence provided contiguously across the reflective liquid crystal portion 1A and the self-luminous element portion 1B. As a result, for example, water can be restrained from penetrating through the boundary in the coating layer 35, which in turn enables restraining degradation of the self-luminous display element 30.

As described here, the present embodiment enables passive drive by adopting bistable liquid crystal display mode as the display mode of the reflective liquid crystal display element 20. As a result, the coating layer 35 no longer needs to be provided only in the self-luminous element portion 1B where the self-luminous display element 30 is disposed, for contacts between the pixel electrode and the TFTs. For example, the entire panel surface may be sealed all together. This eliminates the in-plane boundary in the coating layer 35 from the panel, thereby restraining, for example, penetration of moisture and in turn restraining degradation of the self-luminous display element 30. The following will describe the present embodiment in detail.

Referring to FIG. 2A, the display device 1 has: the display area (active area) 10A where images can be displayed; and a non-display area (non-active area) 10B, surrounding the display area 10A, where no images can be displayed. The non-display area 10B includes: a first non-display area portion 10B1 disposed on the display area 10A side; and a second non-display area portion 10B2 disposed outside the first non-display area portion 10B1. The first non-display area portion 10B1 includes a black matrix layer 24X and can therefore realize a black frame. The second non-display area portion 10B2 includes no black matrix layer.

Referring to FIG. 2B, the display device 1 includes, for example: a row electrode 21P arranged in the row direction and connected to a row electrode signal wire 21PL; and a column electrode 23P arranged in the column direction and connected to a column electrode signal wire 23PL. The row electrode 21P and the row electrode signal wire 21PL are connected in a region overlapping the black matrix layer 24X in a plan view. The column electrode 23P and the column electrode signal wire 23PL are connected in a region overlapping the black matrix layer 24X in a plan view. The row electrode 21P corresponds to the pixel electrode 21, and the column electrode 23P corresponds to the opposite electrode 23. In addition, the row electrode signal wire 21PL and the column electrode signal wire 23PL correspond to a wire 330 (detailed later).

The display device 1 includes the plurality of pixels 1P arranged in a matrix in the display area 10A, and each of the plurality of pixels 1P includes the reflective liquid crystal portion 1A and the self-luminous element portion 1B. The reflective liquid crystal portion 1A and the self-luminous element portion 1B are disposed adjacent to each other in a plan view. A "pixel" is a minimum unit of a display image. The display device 1 may be, for example, either a black and white display device or a color display device. When the display device 1 is a color display device, the pixels 1P may be subpixels. In the current context, a "subpixel" refers to each monochromatic (generally, of a primary color) region in pixels that form a color display image.

The display device 1 further includes a flexible printed circuit (FPC) 10C provided in the non-display area 10B and electrically connected to the first substrate 100. The FPC 10C is a flexible printed board and electrically connects the first substrate 100 to an external (host) control circuit board that is a signal supply source.

The display device 1 has, for example, a polygonal profile as shown in FIG. 2A. The FPC 10C may be provided on one of the sides of the polygon. This polygonal display device 1 may be used as a module for a smart watch.

Referring to FIG. 1, the display device 1 in accordance with the present embodiment includes: the first substrate 100 including the current supply TFTs 12 as the switching elements; the liquid crystal layer 22 containing the liquid crystal molecules 22A; and the second substrate 200 including the opposite electrode 23, which are stacked in the stated order.

In the reflective liquid crystal portion 1A, the first substrate 100 includes a first support substrate 101, a gate insulating film 103, an inorganic insulating film 104, an insulating film 105, the reflector 21X, the coating layer 35, and the pixel electrode 21, which are stacked in the stated order toward the liquid crystal layer 22 side. In the self-luminous element portion 1B, the first substrate 100 includes: the first support substrate 101; a source electrode 12S, a semiconductor layer 102, and a drain electrode 12D; the gate insulating film 103; a gate electrode 12G; the inorganic insulating film 104; the insulating film 105; the first electrode 31; a self-luminous-element-side insulating film 32; the organic layer 33; the second electrode 34; and the coating layer 35, which are stacked in the stated order toward the liquid crystal layer 22 side.

The source electrode 12S, the gate electrode 12G, the drain electrode 12D, and the semiconductor layer 102 form the current supply TFT 12. The first electrode 31, the organic layer 33, and the second electrode 34 form the self-luminous display element 30. The self-luminous display element 30 is covered by the coating layer 35. The first electrode 31 is, for example, an anode. The organic layer 33 is, for example, an organic light-emitting diode (OLED) layer. The second electrode 34 is, for example, a cathode. The self-luminous display element 30 is, for example, an organic electroluminescence (EL) display element.

The second substrate 200 includes a second support substrate 201, a color filter layer 24, and the opposite electrode 23, which are stacked in the stated order toward the liquid crystal layer 22 side. There is provided a circular polarizer 25 on a face of the second substrate 200 opposite the liquid crystal layer 22.

The reflector 21X, the pixel electrode 21, the liquid crystal layer 22, and the opposite electrode 23, disposed in the reflective liquid crystal portion 1A, form the reflective liquid crystal display element 20 that operates in bistable liquid crystal display mode. Bistable liquid crystal display elements may be designed, for example, as in Japanese Patent No. 4530217 and Japanese Patent No. 4942898, which are published Japanese Patents. The present embodiment incorporates herein by reference the entire content of Japanese Patent No. 4530217 and Japanese Patent No. 4942898.

In the present embodiment, contact between the switching element and the pixel electrode in the reflective liquid crystal portion can be eliminated by separating the reflective electrode 21R used in Patent Literature 1 described above into the pixel electrode 21 and the reflector 21X. Furthermore, in the present embodiment, by separating the reflective electrode 21R into the pixel electrode 21 and the reflector 21X, the pixel electrode 21 between adjacent pixels does not need to be separated, which enables passive matrix drive.

Figure 4:
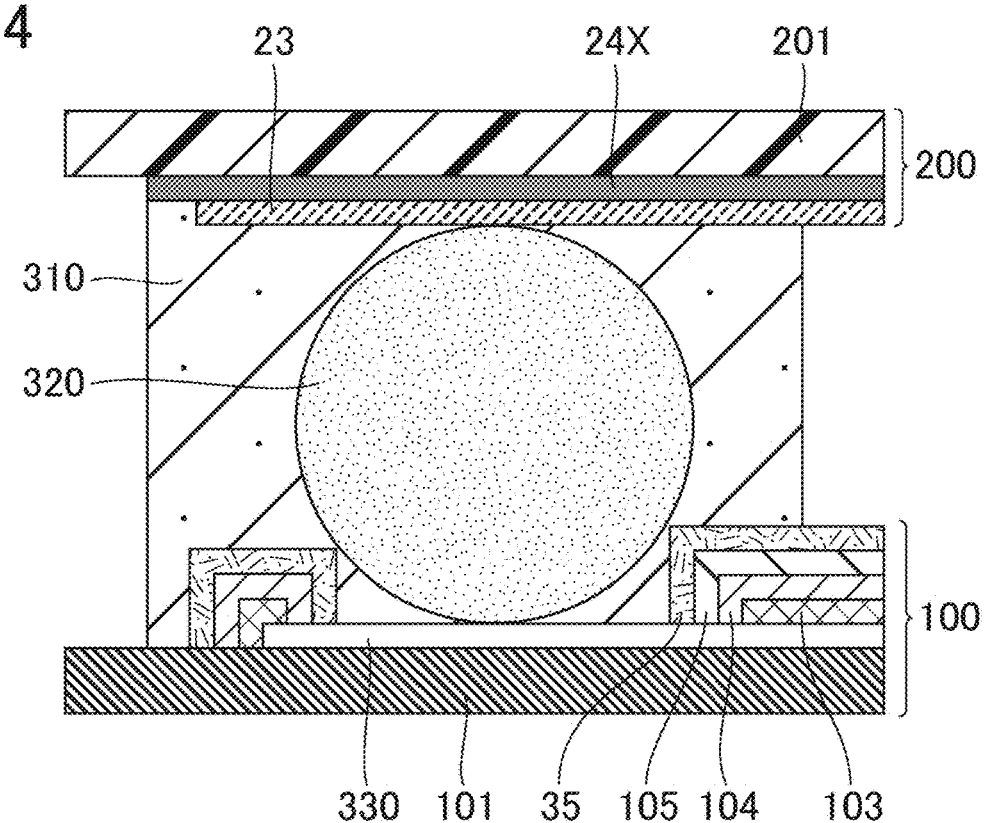
FIG. 4 is a schematic cross-sectional view of a contact between an opposite electrode and a wire in a non-display area of the display device in accordance with Embodiment 1.
Figure 5:
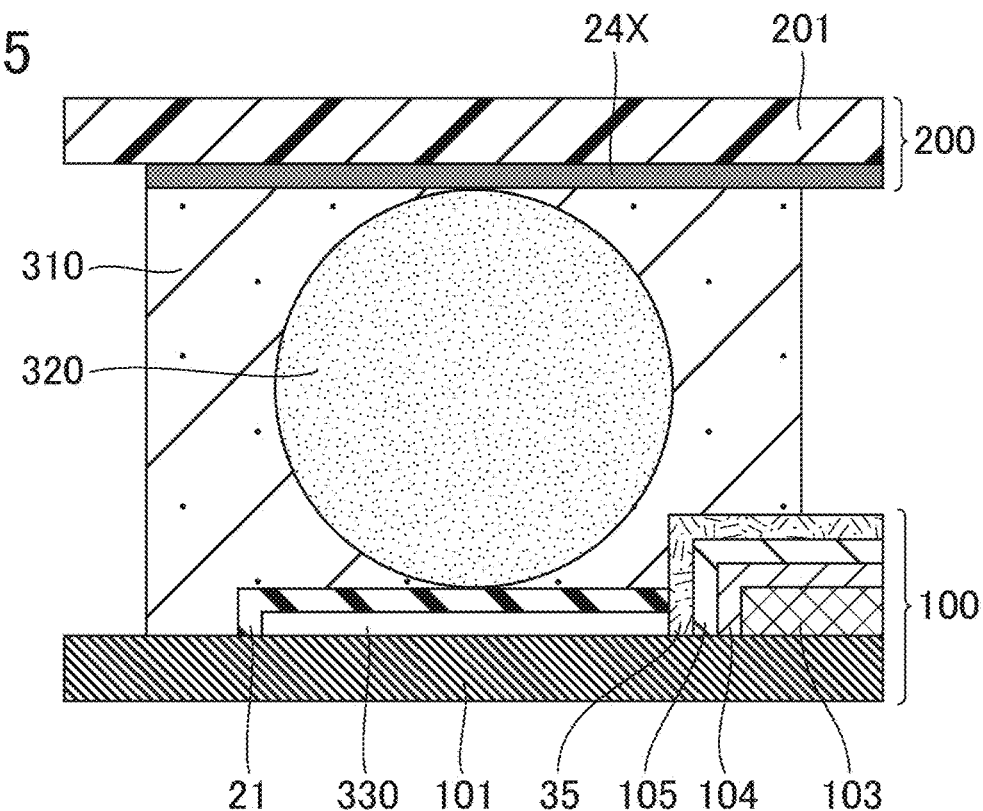
FIG. 5 is a schematic cross-sectional view of a contact between a pixel electrode and a wire in the non-display area of the display device in accordance with Embodiment 1.

FIG. 4 is a schematic cross-sectional view of a contact between an opposite electrode and a wire in a non-display area of the display device in accordance with Embodiment 1. FIG. 5 is a schematic cross-sectional view of a contact between a pixel electrode and a wire in the non-display area of the display device in accordance with Embodiment 1. Referring to FIGS. 4 and 5, the first substrate 100 and the second substrate 200 are adhered together, but separated by a gap owing to a seal 310 provided on a periphery (non-display area 10B). The liquid crystal molecules 22A are tightly sealed in the gap, forming the liquid crystal layer 22. The seal 310 is mixed with spherical spacers 320 that have a gold-coated surface. Referring to FIG. 4, the display device 1 has: the non-display area 10B provided around the display area 10A; and the wire 330 provided in the non-display area 10B of the first substrate 100. The opposite electrode 23 and the wire 330 are connected in the non-display area 10B. In addition, referring to FIG. 5, the pixel electrode 21 and the wire 330 are connected in the non-display area 10B. Both connecting portions are located outside the TFE (coating layer 35), and there is no need to provide contact holes in, for example, the TFE and various insulating layers for the connection. The wire 330 is connected via the FPC 10C to an external (host) control circuit board that is a signal supply source.

The liquid crystal layer 22 contains the liquid crystal molecules 22A. It is difficult to provide the liquid crystal layer 22 only in the reflective liquid crystal portion 1A and is provided across the entire face including the self-luminous element portion 1B as well as the opposite electrode 23. In the liquid crystal layer 22, the liquid crystal molecules 22A are aligned in such a manner as to assume either one of a first stable state and a second stable state, which differ from each other, in the absence of applied voltage where a voltage that is lower than a threshold value is applied across the pixel electrode 21 and the opposite electrode 23. The liquid crystal molecules 22A are switched between the first stable state and the second stable state by applying a pulsed voltage across the pixel electrode 21 and the opposite electrode 23. Although a pulsed voltage is applied across the pixel electrode 21 and the opposite electrode 23 in switching between the first stable state and the second stable state, there is no need to continuously apply the voltage to maintain the first stable state and the second stable state. Note that the "absence of applied voltage" includes zero voltage being applied across the pixel electrode 21 and the opposite electrode 23.

The liquid crystal molecules 22A are liquid crystal molecules in which the dielectric anisotropy ($\Delta\varepsilon$), defined by following equation (L), has either a positive value or a negative value. The liquid crystal molecules with positive dielectric anisotropy are also referred to as a positive liquid crystal, and the liquid crystal molecules with negative dielectric anisotropy are also referred to as a negative liquid crystal. The direction of the major axis of the liquid crystal molecules matches with the direction of the slow axis. The liquid crystal molecules 22A in accordance with the present embodiment are preferably a positive liquid crystal.

$$\Delta\varepsilon = \text{(Permittivity of liquid crystal molecules along major axis)} - \text{(Permittivity of liquid crystal molecules along minor axis)} \quad (L)$$

The display device 1 includes: a vertical alignment film 41 disposed between the first substrate 100 and the liquid crystal layer 22; and a grating layer 42 disposed between the second substrate 200 and the liquid crystal layer 22. The liquid crystal layer 22 assumes either one of the first stable state in which the liquid crystal molecules 22A are vertically aligned and the second stable state in which the liquid crystal molecules 22A assumes HAN (Hybrid Aligned Nematic) alignment in the absence of applied voltage where a voltage that is lower than a threshold value is applied across the pixel electrode 21 and the opposite electrode 23. The liquid crystal molecules 22A are switched between the first stable state and the second stable state by applying a pulsed voltage across the pixel electrode 21 and the opposite electrode 23. The alignment of the liquid crystal molecules 22A in the first stable state is alternatively referred to as the initial alignment. In other words, the initial alignment of the liquid crystal molecules 22A in accordance with the present embodiment is a vertical alignment. In the present embodiment, the circular polarizer 25 is set up in such a manner that the display device 1 can produce a black display in the first stable state (vertical alignment). In the present embodiment, the display device 1 produces a white display in the second stable state (HAN alignment).

The liquid crystal molecules 22A switch from the first stable state to the second stable state upon the application of a prescribed pulse voltage (voltage that has a first pulse waveform) across the pixel electrode 21 and the opposite electrode 23, whereby the liquid crystal molecules 22A on the grating layer 42 side change their alignment to an HAN alignment. In addition, the liquid crystal molecules 22A switch from the second stable state to the first stable state upon the application of a prescribed pulse voltage (voltage that has a second pulse waveform) across the pixel electrode 21 and the opposite electrode 23, whereby the liquid crystal molecules 22A on the grating layer 42 side change their alignment to a vertical alignment. A voltage needs to be applied only when the alignment is to be changed, and there is no need to maintain the voltage. This bistable liquid crystal display mode is alternatively referred to as "ZBD (zenithal bistable display)." Further detail is given below.

Figure 6:
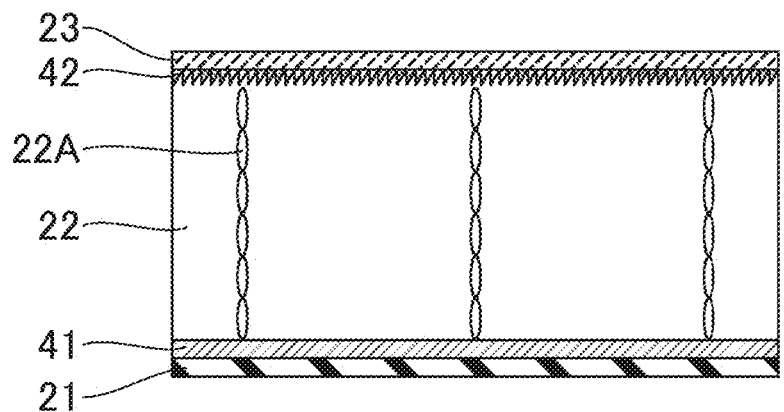
FIG. 6 is a schematic cross-sectional view of liquid crystal molecules in the display device in accordance with Embodiment 1 in a homeotropic alignment.
Figure 7:
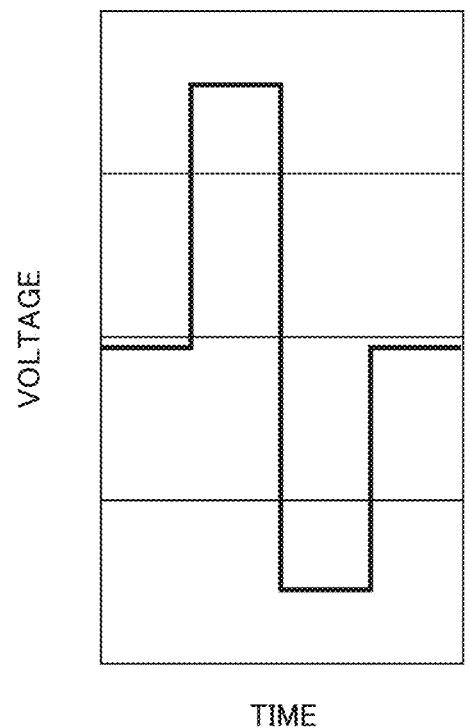
FIG. 7 is a diagram representing a first pulse waveform of a voltage applied across the pixel electrode and the opposite electrode in the display device in accordance with Embodiment 1.
Figure 8:
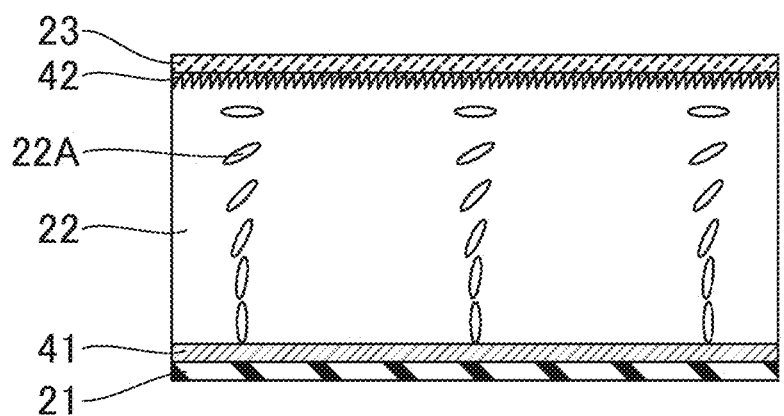
FIG. 8 is a schematic cross-sectional view of liquid crystal molecules in the display device in accordance with Embodiment 1 in an HAN alignment.
Figure 9:
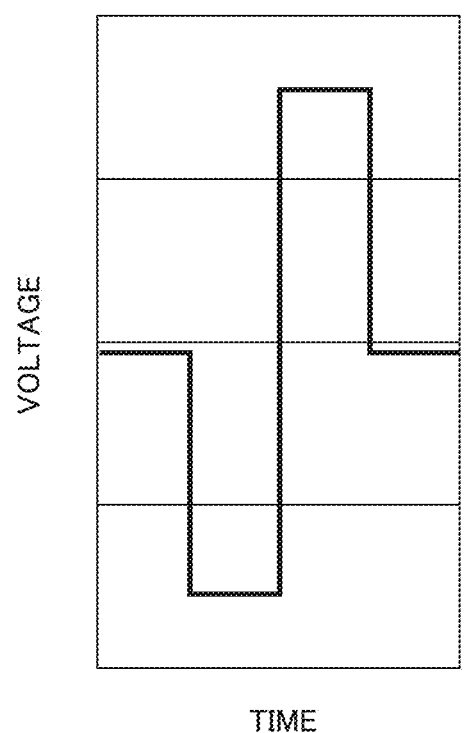
FIG. 9 is a diagram representing a second pulse waveform of the voltage applied across the pixel electrode and the opposite electrode in the display device in accordance with Embodiment 1.

FIG. 6 is a schematic cross-sectional view of liquid crystal molecules in the display device in accordance with Embodiment 1 in a homeotropic alignment. FIG. 7 is a diagram representing the first pulse waveform of the voltage applied across the pixel electrode and the opposite electrode in the display device in accordance with Embodiment 1. FIG. 8 is a schematic cross-sectional view of liquid crystal molecules in the display device in accordance with Embodiment 1 in an HAN alignment. FIG. 9 is a diagram representing a second pulse waveform of the voltage applied across the pixel electrode and the opposite electrode in the display device in accordance with Embodiment 1. FIG. 6 represents the initial alignment state, in other words, the first stable state. FIG. 8 represents the second stable state.

In the first stable state, the liquid crystal molecules 22A are in a homeotropic alignment (vertical alignment), as shown in FIG. 6, between the vertical alignment film 41 disposed on the first substrate 100 side and the grating layer 42 disposed on the second substrate 200 side. At this stage, if the pulsed voltage shown in FIG. 7 is applied across the pixel electrode 21 on the first substrate 100 side and the opposite electrode 23 on the second substrate 200 side, the liquid crystal molecules 22A on the grating layer 42 side are released from anchoring and rotate in the plane of the drawing (FIG. 6). The rotated liquid crystal molecules 22A are realigned to the second stable state, assuming the HAN alignment shown in FIG. 8.

In the HAN alignment state shown in FIG. 8, if a voltage that has the pulse waveform shown in FIG. 9 is applied across the pixel electrode 21 and the opposite electrode 23, the liquid crystal molecules 22A on the grating layer 42 side are released from anchoring and rotate in the plane of the drawing (FIG. 8). The rotated liquid crystal molecules 22A are realigned to the first stable state, assuming the homeotropic alignment shown in FIG. 6.

Although there is a need to apply a pulsed voltage for switching between the first stable state shown in FIG. 6 and the second stable state shown in FIG. 8, there is no need to continuously apply the voltage across the pixel electrode 21 and the opposite electrode 23 to maintain the two stable states because both the first stable state and the second stable state are energetically stable states.

The vertical alignment film 41 is provided across the entire face of the display area 10A. The vertical alignment film has a function of aligning the liquid crystal molecules in the liquid crystal layer vertically with respect to the surface of the vertical alignment film when the application voltage across the liquid crystal layer is lower than the threshold voltage. In the current context, the "liquid crystal molecules being aligned vertically with respect to the surface of the vertical alignment film" indicates that the liquid crystal molecules have a pretilt angle of from 85° to 90°, both inclusive, with respect to the surface of the vertical alignment film. The pretilt angle of liquid crystal molecules refers to the angle by which the major axis of the liquid crystal molecules inclines relative to the primary face of each substrate when no voltage is being applied across the liquid crystal layer. The magnitude of the pretilt varies in particular with the combination of the alignment film or the grating layer and the liquid crystal molecules.

The vertical alignment film 41 may be made of a common material that is well-known in the field of liquid crystal display panels such as a polymer including polyimide in the main chain, a polymer including polyamic acid in the main chain, or a polymer including polysiloxane in the main chain. The alignment film can be formed by applying an alignment film material by any application method such as flexo printing or inkjet coating.

The grating layer 42 is provided across the entire display area 10A. The grating layer 42 has, for example, grooves that has a triangular cross-section on the surface on the liquid crystal layer 22 side. The grating layer is formed, for example, from an insulating film. The grating layer 42 is preferably transparent.

Two stable alignment states, that is, a state in which the liquid crystal molecules 22A on the second substrate 200 side are vertically aligned and a state in which the liquid crystal molecules 22A on the second substrate 200 side are horizontally aligned, are obtained by optimizing, for example, the depth and interval (pitch) of the grooves when the application voltage across the liquid crystal layer 22 is lower than the threshold voltage. Furthermore, the liquid crystal molecules 22A can be switched between the alignment state shown in FIG. 6 and the alignment state shown in FIG. 8, by applying voltage pulses with different polarities across the pixel electrode 21 and the opposite electrode 23. These two alignment states are maintained even when no voltage pulses are applied.

In the first stable state, the pretilt angle of the liquid crystal molecules 22A on the first substrate 100 side is preferably from 85° to 90°, both inclusive, and, the pretilt angle of the liquid crystal molecules 22A on the second substrate 200 side is preferably from 85° to 90°, both inclusive. This particular structure enables producing an even better black display.

In the second stable state, the pretilt angle of the liquid crystal molecules 22A on the first substrate 100 side is preferably from 85° to 90°, both inclusive, and the pretilt angle of the liquid crystal molecules 22A on the second substrate 200 side is preferably from 0° to 5°, both inclusive. This particular structure enables producing an even better white display.

The first support substrate 101 is, for example, a glass substrate or an insulating substrate made of a resin film of, for example, polyimide. The second support substrate 201, facing a viewer, may be, for example, an insulating substrate made of, for example, glass or a transparent (transmissive) film.

The semiconductor layer 102 is provided in the self-luminous element portion 1B, not in the reflective liquid crystal portion 1A. In the current context, a "member being provided in a region" indicates that the member is provided at least in a part of the region in a plan view. In addition, a "member being not provided in a region" indicates that the member is not provided at all in the region in a plan view.

The semiconductor layer 102 may be made of a semiconductor often used in display devices, for example, low-temperature polycrystalline silicon (hereinafter, "LTPS") or indium gallium zinc oxide (hereinafter, "In—Ga—Zn—O").

The source electrode 12S, the drain electrode 12D, and the gate electrode 12G are provided in the self-luminous element portion 1B, not in the reflective liquid crystal portion 1A. The source electrode 12S, the drain electrode 12D, and the gate electrode 12G may be made of, for example, a conductive layer containing either a metal such as titanium, aluminum, molybdenum, copper, or chromium or an alloy of any of these metals.

The gate insulating film 103 is provided across the entire display area 10A. In the current context, a "member being provided across an entire region" indicates that the member is provided across substantially the entire region in a plan view, except for contact holes and other like specific parts. The gate insulating film 103 is preferably an inorganic insulating film. The inorganic insulating film may be, for example, either an inorganic film such as a silicon oxide ($SiO_x$) film, a silicon nitride ($Si_xN_y$) film, a silicon oxynitride ($SiO_xN_y$, where x>y) film, or a silicon nitroxide ($SiN_xO_y$, where x>y) film or a stack of any of these films.

The inorganic insulating film 104 is provided across the entire display area 10A. The inorganic insulating film 104 may be, for example, either an inorganic film such as a silicon oxide ($SiO_x$) film, a silicon nitride ($Si_xN_y$) film, a silicon oxynitride ($SiO_xN_y$, where x>y) film, or a silicon nitroxide ($SiN_xO_y$, where x>y) film or a stack of any of these films.

The insulating film 105 is provided across the entire display area 10A. The insulating film 105 may be, an inorganic insulating film, an organic insulating film, or a stack of an inorganic insulating film and an organic insulating film. The inorganic insulating film may be, for example, either an inorganic film such as a silicon oxide ($SiO_x$) film, a silicon nitride ($Si_xN_y$) film, a silicon oxynitride ($SiO_xN_y$, where x>y) film, or a silicon nitroxide ($SiN_xO_y$, where x>y) film or a stack of any of these films. The organic insulating film may be, for example, either an organic film of an acrylic resin, a polyimide resin, or a novolac resin or a stack of any of these films.

The first support substrate 101 includes on a surface thereof: TFTs such as drive TFTs 11 and the current supply TFTs 12; and wiring such as bus lines. The insulating film 105 has a function of planarizing this surface and is, for this reason, alternatively called a planarization film. The insulating film 105 is provided for the purpose of planarizing the surface by eliminating irregularities in the surface between those parts where, for example, TFTs are provided and those parts where, for example, no TFTs are provided and is, for this reason, preferably made of an organic material such as a polyimide resin.

The reflector 21X is provided in the reflective liquid crystal portion 1A, not in the self-luminous element portion 1B. The reflector 21X is provided between the insulating film 105 and the coating layer 35. The reflector 21X has a function of reflecting, toward the second substrate 200 side, the light incident on the second substrate 200 side and having passed through the liquid crystal layer 22. A reflective display is performed by reflecting the incident light from the second substrate 200 side off the reflector 21X and letting the reflected light travel through the liquid crystal layer 22. The reflector 21X is formed by forming a film of various high reflection metals such as Al and Ag alloys.

The reflector 21X is preferably disposed in the same layer as the first electrode 31. The display device 1 configured in this manner allows for simultaneous formation of the reflector 21X and the first electrode 31 and can therefore be manufactured more easily and conveniently.

The pixel electrode 21 and the opposite electrode 23 are provided across the entire display area 10A. The pixel electrode 21 and the opposite electrode 23 may be formed, for example, by forming a monolayer or mulilayered film of, a transparent conductive material such as indium tin oxide (ITO), indium zinc oxide (IZO), zinc oxide (ZnO), or tin oxide (SnO) or an alloy of these materials by, for example, sputtering and thereafter patterning the monolayer or mulilayered film by photolithography.

The pixel electrode 21 and the opposite electrode 23 are connected to a terminal section provided in the non-display area 10B. The passive drive of the reflective liquid crystal display element 20 is realized by controlling, through this terminal section, the voltage across the pixel electrode 21 and the opposite electrode 23. As described here, the reflective liquid crystal display element 20 is passively driven and for this reason, does not require active elements (diodes, transistors, etc.). Signals are inputted from the terminal section provided on an end face (non-display area 10B) of the display device 1. Therefore, the pixel electrode 21 and the opposite electrode 23, which are transparent electrodes, are provided in the display area 10A, but, wiring, such as the gate bus lines and the source bus lines, for controlling the voltage across the pixel electrode 21 and the opposite electrode 23 are not provided in the display area 10A.

The color filter layer 24 is provided between the second support substrate 201 and the opposite electrode 23. The color filter layer 24 is, for example, a red color filter, a green color filter, or a blue color filter. The red color filter, the green color filter, and the blue color filter are made of, for example, a transparent resin containing a pigment.

The inclusion of the color filter layer 24 enables a color display by the reflective liquid crystal display element 20. In contrast, a color display can be produced also on the self-luminous display element 30 side by using the color filter layer 24. Nevertheless, when, for example, red light, green light, and blue light are emitted directly by selecting a material for the organic layer 33, the color filter layer 24 is unnecessary on the self-luminous display element 30 side.

The circular polarizer 25 refers to a polarizer that converts incident, nonpolarized light to circularly polarized light. The circular polarizer 25 includes, for example, a linear polarizer and a λ/4 retarder. Furthermore, a λ/2 retarder may be used in combination with a λ/4 retarder so as to exhibit ¼ wavelength conditions across a broad range of wavelengths. The λ/4 retarder includes an optical film prepared by single axis extension.

The reflective liquid crystal display element 20 includes the circular polarizer 25. This structure can achieve the following effects. The light having passed through the circular polarizer 25 is changed to, for example, right polarized light as a result of the phase of linearly polarized light being shifted by the ¼ wavelength. Since the initial alignment of the liquid crystal molecules 22A is a vertical alignment, external light is passed unchanged through the liquid crystal layer 22 and reflected off the reflector 21X so that the polarization flips from right circular polarization to left circular polarization. Therefore, the external light having travelled in the direction opposite to the incident direction and having returned to the circular polarizer 25 forms linearly polarized light with an angle perpendicular by 90° with respect to the transmission axis of the linear polarizer and is not passed through the circular polarizer 25, thereby producing a black display.

In contrast, if a voltage that has the first pulse waveform is applied across the pixel electrode 21 and the opposite electrode 23, and the liquid crystal molecules 22A assume an HAN alignment, external light is further shifted in phase by the ¼ wavelength by the liquid crystal layer 22 and therefore is retarded by ½ the wavelength upon reaching the reflector 21X, and reflects as linearly polarized light. After being reflected, the external light follows a path opposite to the incoming path and is therefore passed through the circular polarizer 25, thereby producing a white display.

Furthermore, if a voltage that has the second pulse waveform, which differs from the first pulse waveform, is applied across the pixel electrode 21 and the opposite electrode 23, and the liquid crystal molecules 22A assume a vertical alignment, a black display is produced as described above.

The self-luminous display element 30 includes: the first electrode 31 provided in the self-luminous element portion 1B of 1P of one pixel and provided on the liquid crystal layer 22 side of the insulating film 105; the self-luminous-element-side insulating film 32 provided around the first electrode 31; the organic layer 33 provided on the liquid crystal layer 22 side of the first electrode 31 surrounded by the self-luminous-element-side insulating film 32; and the second electrode 34 entirely covering the self-luminous-element-side insulating film 32 and the organic layer 33 (covering the entire faces on the liquid crystal layer 22 side of the self-luminous-element-side insulating film 32 and the organic layer 33).

The first electrode 31 is, for example, formed as an anode electrode. In the present embodiment, since the display screen is viewed from the upper side in FIG. 1, the first electrode 31 is formed as a reflective electrode and structured so as to project all the emission upward. Therefore, its material is selected from reflective materials, depending on, for example, a relationship of a work function with, for example, the organic layer 33, which is in contact with this first electrode 31. The first electrode 31 is made from, for example, a stack of ITO/APC/ITO films.

The self-luminous-element-side insulating film 32 is what is also called an insulating bank or a partition wall. The self-luminous-element-side insulating film 32 is formed to delimit a light-emitting region for the self-luminous display element 30 and also to prevent the first electrode 31 and the second electrode 34 from coming into contact with each other and hence being short-circuited. The organic layer 33 is stacked on the first electrode 31 surrounded by the self-luminous-element-side insulating film 32. The self-luminous-element-side insulating film 32 is made of, for example, a resin such as polyimide or an acrylic resin.

The organic layer 33 is stacked on the liquid crystal layer 22 side of the exposed, first electrode 31 surrounded by the self-luminous-element-side insulating film 32. This organic layer 33 is shown as a single layer in FIG. 1, but includes a plurality of stacked layers of various materials. In addition, this organic layer 33 is weak to moisture and cannot be patterned after being formed across the entire face. Therefore, the organic layer 33 is formed by selectively vapor-depositing a vaporized or sublimated organic material only to required portions by using a vapor deposition mask.

Specifically, the organic layer 33 includes, for example, as a layer in contact with the first electrode (anode electrode) 31, a hole injection layer composed of a material that exhibits good ionization energy matching for improving hole injection. The organic layer 33 includes, on the liquid crystal layer 22 side of this hole injection layer, a hole transport layer that can improve the stable transport of holes and that can confine electrons inside the light-emitting layer (energy barrier). This hole transport layer is made of, for example, an amine-based material. Furthermore, the organic layer 33 includes a light-emitting layer selected in accordance with an emission wavelength on the liquid crystal layer 22 side of the hole transport layer. The light-emitting layer is formed by, for example, doping $Alq_3$ with a red or green organic fluorescent material for the red and green colors. In addition, a DSA-based organic material is used as a blue material. In contrast, when coloring is done using the color filter layer 24, all the light-emitting layers may be made of the same material without doping. The organic layer 33 further includes, on the liquid crystal layer 22 side of light-emitting layer, an electron transport layer that improves electron injection and that stably transports electrons. The electron transport layer is formed of, for example, $Alq_3$. The stack of films in the organic layer 33 is formed by stacking these layers each to a thickness of approximately a few tens of nanometers. Note that between the organic layer 33 and the second electrode 34, there may be provided, for example, a LiF and/or Liq electron injection layer that improves electron injection. In the present embodiment, the organic layer 33 may include these organic and inorganic layers.

As described earlier, for the light-emitting layer in the stack of films in the organic layer 33, an organic layer of a material in accordance with each of the RGB colors may be deposited. In the example shown in FIG. 1, the light-emitting layers are formed of the same organic material, and the color of emitted light is specified by the color filter layer 24. In addition, for example, the hole transport layer and the electron transport layer are preferably separately deposited using a material suited to the light-emitting layer in view of better light emission performance. However, there are cases where these hole and electron transport layers are stacked using the same material that is common to two or three of the RGB colors in consideration of material cost.

After the stack of films in the organic layer 33 including, for example, an electron injection layer such as a LiF layer is completely formed, the second electrode 34 is formed on the liquid crystal layer 22 side of the self-luminous-element-side insulating film 32 and the organic layer 33. The second electrode 34 needs to be completely covered with the coating layer 35 because the second electrode 34 is made of a transparent material, for example, a thin Mg—Ag eutectic crystal film and for this reason, susceptible to corrosion in moisture.

The self-luminous display element 30 is formed in the self-luminous element portion 1B as described above. For example, the liquid crystal layer 22 and the opposite electrode 23 are provided also on the self-luminous display element 30 as shown in FIG. 1 because as described earlier, it is difficult to provide the liquid crystal layer 22 only in the reflective liquid crystal portion 1A. However, the pixel electrode 21 is not disposed in the self-luminous element portion 1B. Therefore, in the self-luminous element portion 1B, the same state occurs as in the case where the voltage applied across the pixel electrode 21 and the opposite electrode 23 is lower than a threshold value. In other words, although normally black is achieved for external light, the light emitted by the self-luminous display element 30 is the same as in the absence of the liquid crystal layer 22 because the liquid crystal layer 22 is in a vertical alignment, and that light passes through the circular polarizer 25 with no changes at all. Then, since the light having passed through the circular polarizer 25 is visually recognized as is, the image displayed by the emission of light by the self-luminous display element 30 is visually recognized as is from the observation side.

Note that the light emitted by the self-luminous display element 30 decays to appropriately half in the circular polarizer as the light passed through the circular polarizer 25. However, the circular polarizer 25 is preferably disposed also on the self-luminous element portion 1B for the following reasons. When external light enters through the front face, since the first electrode 31 in the self-luminous display element 30 is made of a light-reflective material as described earlier, the display screen becomes highly difficult to visually recognize if the light incident on the front face is reflected, for example, off the first electrode 31 in the self-luminous display element 30 and exits to the outside.

However, if the circular polarizer 25 is provided, since the rotation direction of circularly polarized light is reversed upon being reflected off, for example, the first electrode 31 as described earlier, the reflected light cannot pass through the circular polarizer. As a result, the reflected light can be cut off. Although the self-luminous display element 30 is not activated when there is much external light, since even when the reflective liquid crystal display element 20 is activated, reflected light is generated regardless of whether the self-luminous display element 30 is being in operation, the visual recognizability of the display device 1 significantly decreases even when the reflective liquid crystal display element 20 is being in operation if the circular polarizer 25 is not provided in the self-luminous element portion 1B.

The coating layer 35 is alternatively referred to as a sealing layer or a thin film sealant (TFE: thin film encapsulation). The coating layer 35 is preferably an inorganic insulating film. Examples of the coating layer 35 include inorganic insulating films such as a silicon nitride film and a silicon oxide film. The coating layer 35 may be either a single layer or a stack of two or more layers.

The coating layer 35 is provided contiguously across the reflective liquid crystal portion 1A and the self-luminous element portion 1B. This structure enables restraining the degradation of the self-luminous display element 30. In the current context, a "member being provided contiguously across two regions" indicates that the member is provided across each of the two regions and also seamlessly from one of the two regions to the other in a plan view. The coating layer 35 is provided entirely across each of the reflective liquid crystal portion 1A and the self-luminous element portion 1B and also seamlessly from the reflective liquid crystal portion 1A to the self-luminous element portion 1B in a plan view.

The coating layer 35 is preferably provided contiguously across the plurality of pixels 1P. This structure enables further restraining the penetration of, for example, water through the boundary in the coating layer 35, thereby enabling further restraining the degradation of the self-luminous display element 30. The coating layer 35 is provided entirely across each of the plurality of pixels 1P and also seamlessly between the plurality of pixels 1P in a plan view.

A circuit for driving the self-luminous display element 30 is structured, for example, as in the equivalent circuit diagram in FIG. 3. In other words, a horizontal row of pixels can be selected by connecting the gate electrodes of the drive TFTs 11 to a gate bus line 15 and applying a gate signal (select signal) to the gate bus line 15. In addition, the source electrodes of the drive TFTs 11 are connected to a source bus line 14, so that a vertical column of pixels is ready for data signal inputs. Then, only the pixels where the gate bus line 15 provided with the select signal intersects with the source bus line 14 provided with the data signal is configured to be able to display on the basis of the provided data signal. The drive TFT 11 has a drain electrode thereof connected to the gate electrode 12G of the current supply TFT 12 to control the electric current flowing through the self-luminous display element 30 in response to display information. The drain electrode 12D of the current supply TFT 12 is connected to a current bus line 16, and the source electrode 12S thereof is connected to the first electrode 31 (anode electrode) of the self-luminous display element 30. The second electrode 34 (cathode electrode) of the self-luminous display element 30 is connected to a cathode bus line 17 through contact holes 17c1 and 17c2. This structure enables driving the self-luminous display element 30 provided in the self-luminous element portion 1B.

When the drive TFT 11 is on, an image is displayed by the self-luminous display element 30 by controlling the voltage for the pixel electrode 21 and the opposite electrode 23 so that a voltage that is lower than a threshold value is applied across the pixel electrode 21 and the opposite electrode 23 and also turning on the current supply TFT 12 using the drive TFT 11. In contrast, when the drive TFT 11 is off, no image is displayed by the self-luminous display element 30 by applying a voltage higher than or equal to the threshold value across the pixel electrode 21 and the opposite electrode 23 and also turning off the current supply TFT 12 using the drive TFT 11. An image can be appropriately displayed by turning off/on the image display produced by the reflective liquid crystal display element 20 in synchronism with the turning on/off of the image display produced by the self-luminous display element 30.

Embodiment 2

The present embodiment will focus on features that are unique to the present embodiment, and description of the content that is common to the present embodiment and Embodiment 1 above is omitted. The present embodiment is substantially the same as Embodiment 1, except for the structure of the alignment film disposed between the first substrate 100 and the liquid crystal layer 22.

Figure 10:
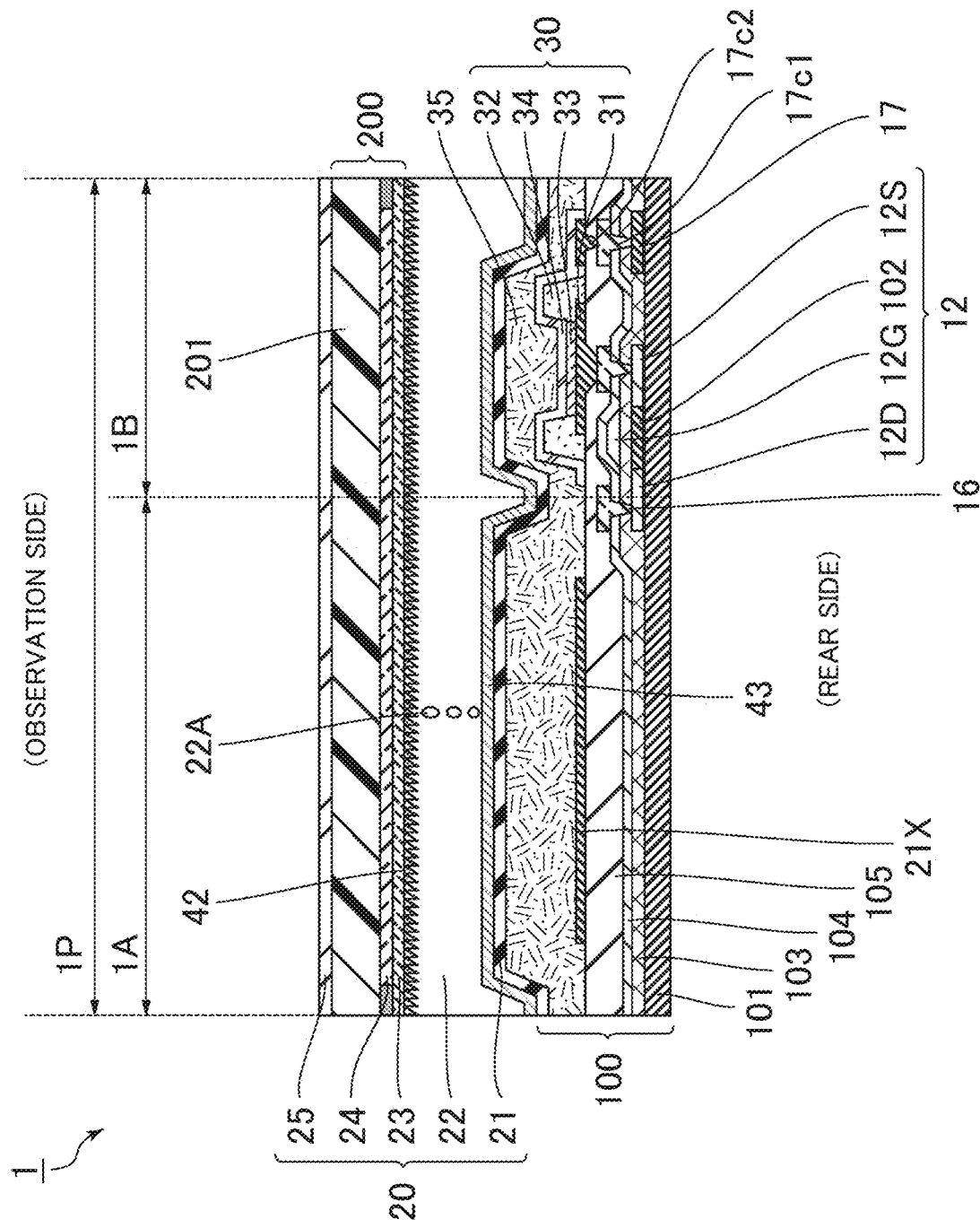
FIG. 10 is a schematic cross-sectional view of a pixel in a display device in accordance with Embodiment 2.
Figure 11:
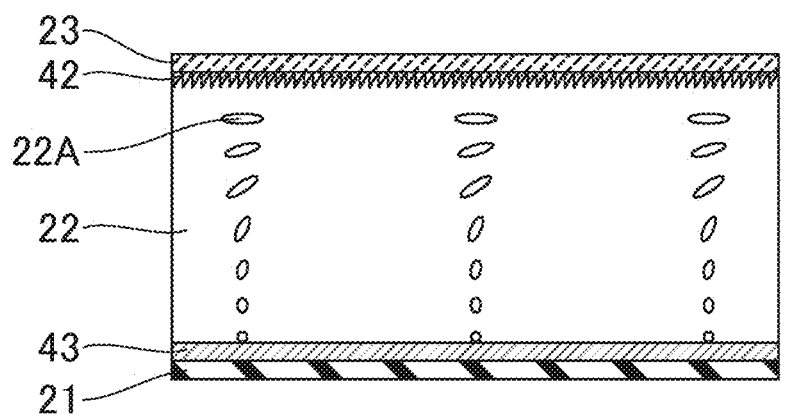
FIG. 11 is a schematic cross-sectional view of liquid crystal molecules in the display device in accordance with Embodiment 2 in a TN alignment.
Figure 12:
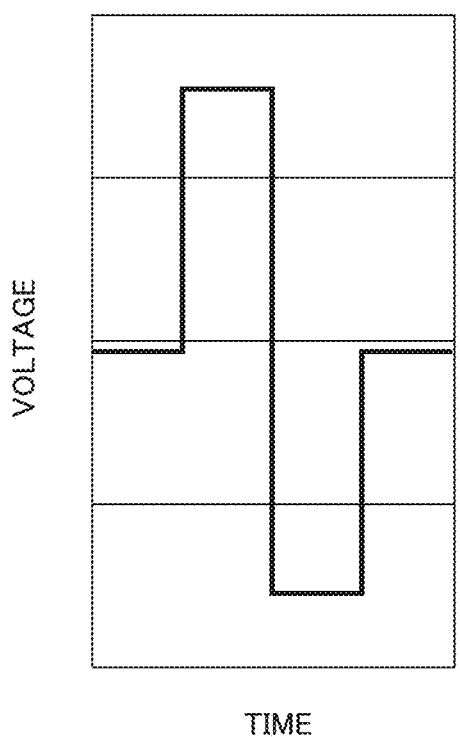
FIG. 12 is a diagram representing a first pulse waveform of a voltage applied across a pixel electrode and an opposite electrode in the display device in accordance with Embodiment 2.
Figure 13:
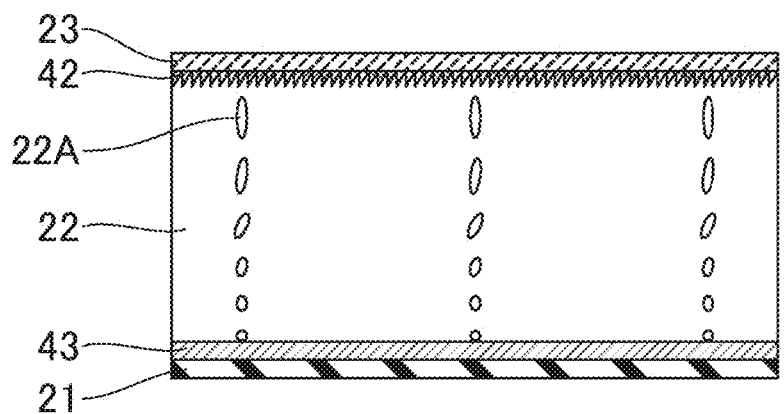
FIG. 13 is a schematic cross-sectional view of liquid crystal molecules in the display device in accordance with Embodiment 2 in an HAN alignment.
Figure 14:
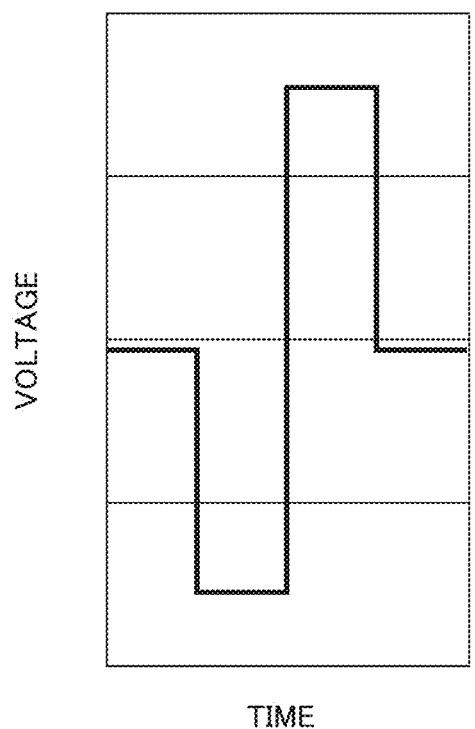
FIG. 14 is a diagram representing a second pulse waveform of the voltage applied across the pixel electrode and the opposite electrode in the display device in accordance with Embodiment 2.

FIG. 10 is a schematic cross-sectional view of a pixel in a display device in accordance with Embodiment 2. FIG. 11 is a schematic cross-sectional view of liquid crystal molecules in the display device in accordance with Embodiment 2 in a TN alignment. FIG. 12 is a diagram representing a first pulse waveform of a voltage applied across a pixel electrode and an opposite electrode in the display device in accordance with Embodiment 2. FIG. 13 is a schematic cross-sectional view of liquid crystal molecules in the display device in accordance with Embodiment 2 in an HAN alignment. FIG. 14 is a diagram representing a second pulse waveform of the voltage applied across the pixel electrode and the opposite electrode in the display device in accordance with Embodiment 2. FIG. 11 shows the initial alignment state, in other words, the first stable state. FIG. 13 shows the second stable state.

The display device 1 in accordance with the present embodiment includes: a pretilted horizontal alignment film 43 disposed between the first substrate 100 and the liquid crystal layer 22; and a grating layer 42 disposed between the second substrate 200 and the liquid crystal layer 22. The liquid crystal layer 22 assumes either one of the first stable state in which the liquid crystal molecules 22A are in a TN (twisted nematic) alignment and the second stable state in which the liquid crystal molecules 22A are in the HAN alignment in the absence of applied voltage where a voltage that is lower than a threshold value is applied across the pixel electrode 21 and the opposite electrode 23. The liquid crystal molecules 22A are switched between the first stable state and the second stable state by applying a pulsed voltage across the pixel electrode 21 and the opposite electrode 23. The initial alignment of the liquid crystal molecules 22A in accordance with the present embodiment is a TN alignment. In the present embodiment, the circular polarizer 25 is set up so that the display device 1 can produce a black display in the first stable state (TN alignment). In the present embodiment, the display device 1 produces a white display in the second stable state (HAN alignment). This bistable liquid crystal display mode is alternatively referred to as ZBD.

The pretilted horizontal alignment film 43 is provided across the entire display area 10A. The pretilted horizontal alignment film 43 has a function of orienting the liquid crystal molecules 22A in the liquid crystal layer 22 to an angle of from 0° exclusive to 10° inclusive with respect to the surface of the horizontal alignment film 43 in the absence of applied voltage. The pretilted horizontal alignment film 43 preferably has a function of orienting the liquid crystal molecules 22A in the liquid crystal layer 22 to an angle of from 3° to 5°, both inclusive, with respect to the surface of the horizontal alignment film 43 in the absence of applied voltage. This structure can render the initial alignment a TN alignment.

The pretilted horizontal alignment film 43 may be made of a common material in the field of liquid crystal display panels such as a polymer including polyimide in the main chain, a polymer including polyamic acid in the main chain, or a polymer including polysiloxane in the main chain.

The pretilted horizontal alignment film 43 is obtained, for example, by forming a film of an alignment film material containing a rubbing alignment film polymer on a substrate, rotating a roller around which a piece of cloth composed of, for example, rayon or cotton is wound while maintaining a constant rotational speed and a constant distance separating the roller from the substrate, and rubbing the surface of the film containing the rubbing alignment film polymer in a prescribed direction. The pretilted horizontal alignment film 43 is obtained, for example, by performing a rubbing process on the film surface of the alignment film. The rubbing process may be done from the far side toward the near side of the drawing (FIG. 10).

In the first stable state, the liquid crystal molecules 22A are in a TN alignment between the pretilted horizontal alignment film 43 disposed on the first substrate 100 side and the grating layer 42 disposed on the second substrate 200 side as shown in FIG. 11. At this stage, by applying the pulsed voltage shown in FIG. 12 across the pixel electrode 21 on the first substrate 100 side and the opposite electrode 23 on the second substrate 200 side, the liquid crystal molecules 22A on the grating layer 42 side are released from anchoring and rotated. The rotated liquid crystal molecules 22A are realigned to the second stable state, assuming the HAN alignment shown in FIG. 13.

In the HAN alignment state shown in FIG. 13, by applying the pulsed voltage shown in FIG. 14 across the pixel electrode 21 and the opposite electrode 23, the liquid crystal molecules 22A on the grating layer 42 side are released from anchoring and rotated. The rotated liquid crystal molecules 22A are realigned to the first stable state, assuming the TN alignment shown in FIG. 11.

Although there is a need to apply a pulsed voltage for switching between the first stable state shown in FIG. 11 and the second stable state shown in FIG. 13, there is no need to continuously apply the voltage across the pixel electrode 21 and the opposite electrode 23 to maintain the two stable states because both the first stable state and the second stable state are energetically stable states.

In the first stable state, the pretilt angle of the liquid crystal molecules 22A on the first substrate 100 side is preferably from 3° to 5°, both inclusive, the pretilt angle of the liquid crystal molecules 22A on the second substrate 200 side is preferably from 0° to 5°, both inclusive, and the alignment direction of the liquid crystal molecules 22A on the first substrate 100 side and the alignment direction of the liquid crystal molecules 22A on the second substrate 200 side preferably make an angle of from 80° to 90°, both inclusive, in a plan view. This structure enables producing a better black display.

In the second stable state, the pretilt angle of the liquid crystal molecules 22A on the first substrate 100 side is preferably from 3° to 5°, both inclusive, and the pretilt angle of the liquid crystal molecules 22A on the second substrate 200 side is preferably from 85° to 90°, both inclusive. This structure enables producing a better white display.

Embodiment 3

The present embodiment will focus on features that are unique to the present embodiment, and description of the content that is common to the present embodiment and Embodiment 1 above is omitted. The present embodiment is substantially the same as Embodiment 1, except for the structure of the alignment film disposed between the first substrate 100 and the liquid crystal layer 22, the provision of an alignment film in place of the grating layer between the second substrate 200 and the liquid crystal layer 22, and the use of a linear polarizer in place of the circular polarizer 25.

Figure 15:
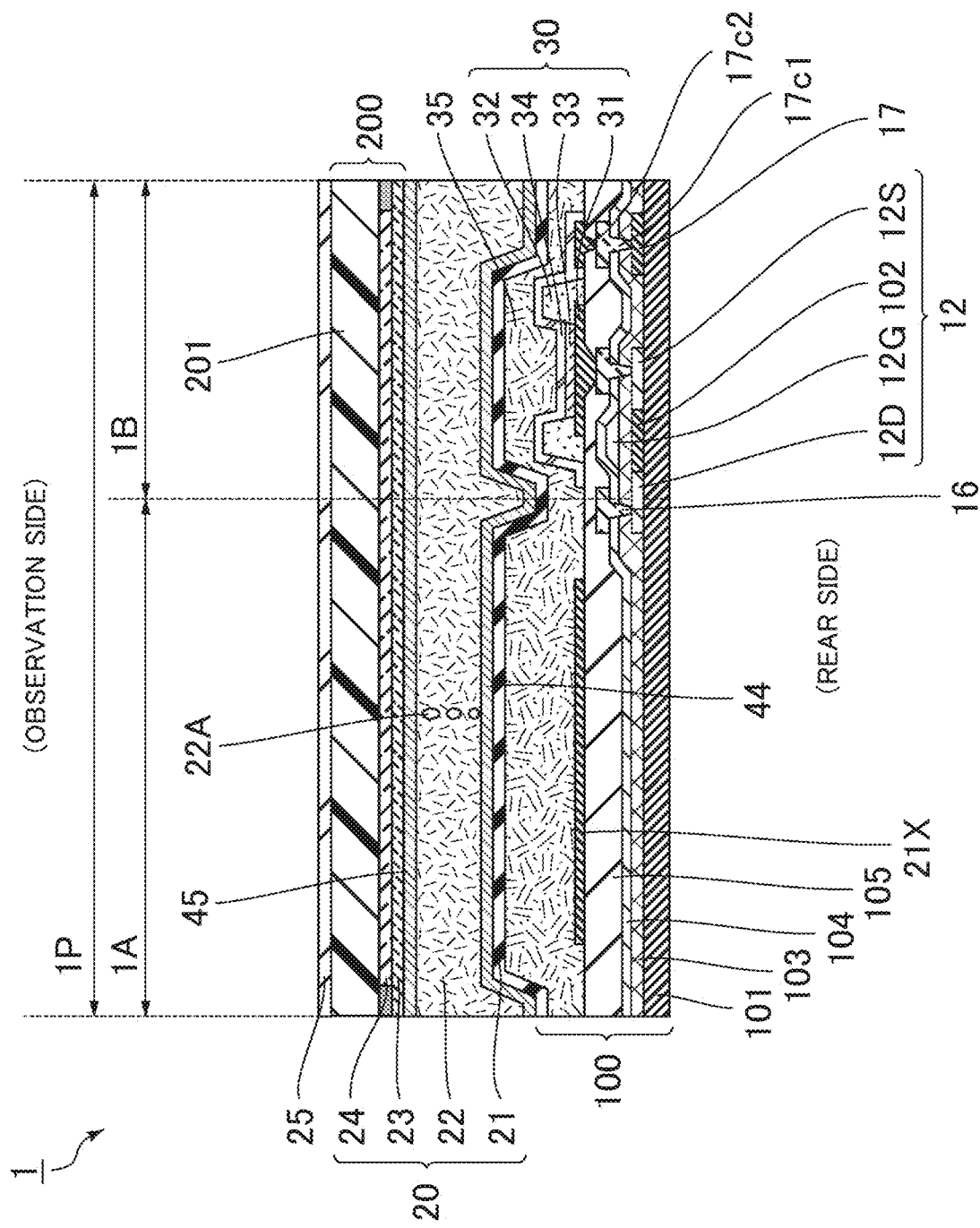
FIG. 15 is a schematic cross-sectional view of a pixel in a display device in accordance with Embodiment 3.
Figure 16:
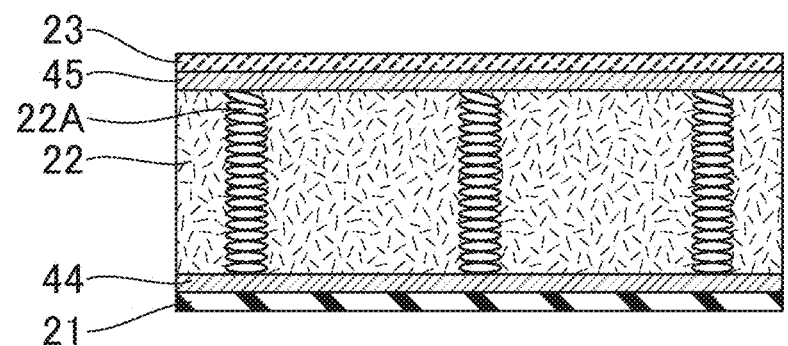
FIG. 16 is a schematic cross-sectional view of liquid crystal molecules in the display device in accordance with Embodiment 3 in a homogeneous alignment.
Figure 17:
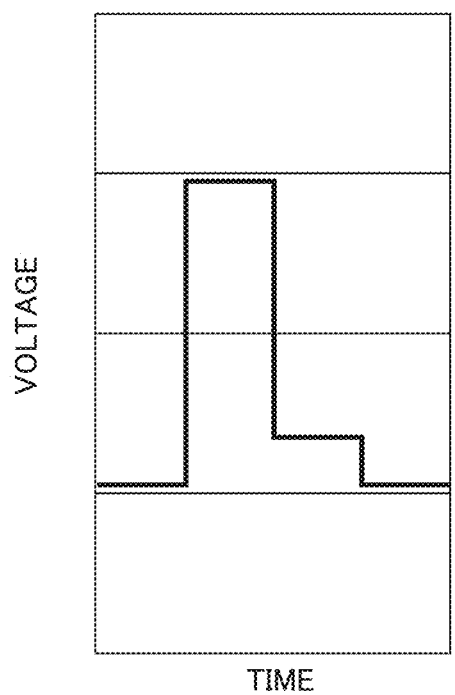
FIG. 17 is a diagram representing a first pulse waveform of a voltage applied across a pixel electrode and an opposite electrode in the display device in accordance with Embodiment 3.
Figure 18:
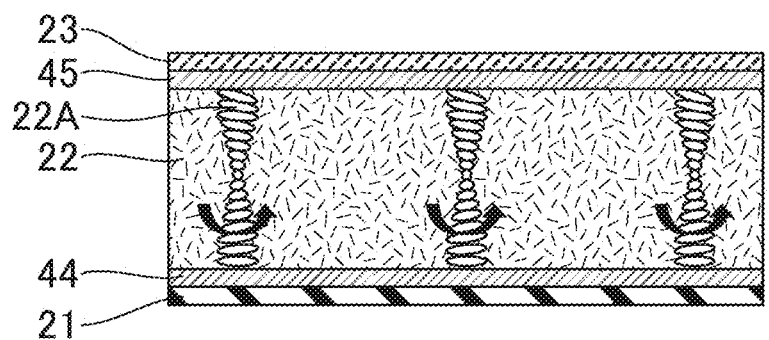
FIG. 18 is a schematic cross-sectional view of liquid crystal molecules in the display device in accordance with Embodiment 3 in a twisted alignment.
Figure 19:
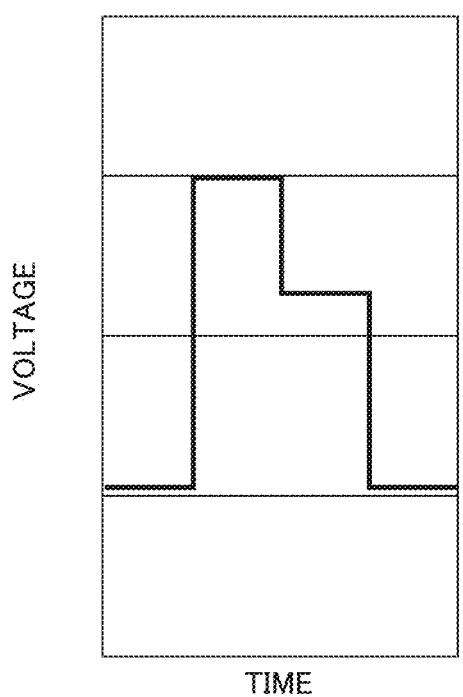
FIG. 19 is a diagram representing a second pulse waveform of the voltage applied across the pixel electrode and the opposite electrode in the display device in accordance with Embodiment 3.

FIG. 15 is a schematic cross-sectional view of a pixel in a display device in accordance with Embodiment 3. FIG. 16 is a schematic cross-sectional view of liquid crystal molecules in the display device in accordance with Embodiment 3 in a homogeneous alignment. FIG. 17 is a diagram representing a first pulse waveform of a voltage applied across a pixel electrode and an opposite electrode in the display device in accordance with Embodiment 3. FIG. 18 is a schematic cross-sectional view of liquid crystal molecules in the display device in accordance with Embodiment 3 in a twisted alignment. FIG. 19 is a diagram representing a second pulse waveform of the voltage applied across the pixel electrode and the opposite electrode in the display device in accordance with Embodiment 3. FIG. 16 shows the initial alignment state, in other words, the first stable state. FIG. 18 shows the second stable state.

The display device 1 in accordance with the present embodiment includes: a weak anchoring alignment film 44 disposed between the first substrate 100 and the liquid crystal layer 22; and a strong anchoring alignment film 45 disposed between the second substrate 200 and the liquid crystal layer 22, as shown in FIG. 15. The liquid crystal layer 22 assumes either one of the first stable state in which the liquid crystal molecules 22A are in a homogeneous alignment and the second stable state in which the liquid crystal molecules 22A on the first substrate 100 side assume a twisted alignment that is rotated by 180° from the first stable state in a plan view, in the absence of applied voltage where a voltage that is lower than a threshold value is applied across the pixel electrode 21 and the opposite electrode 23. The liquid crystal molecules 22A are switched between the first stable state and the second stable state by applying a pulsed voltage across the pixel electrode 21 and the opposite electrode 23. The initial alignment of the liquid crystal molecules 22A in accordance with the present embodiment is a homogeneous alignment. In the present embodiment, the circular polarizer 25 is set up so that the display device 1 can produce a black display in the first stable state (homogeneous alignment). In the present embodiment, the display device 1 produces a white display in the second stable state (twisted alignment). This bistable liquid crystal display mode is referred to as BiNem.

The liquid crystal layer 22 may have a cell gap specified to, for example, 2 μm.

The weak anchoring alignment film 44 and the strong anchoring alignment film 45 are provided across the entire display area 10A. The weak anchoring alignment film 44 and the strong anchoring alignment film 45 are, for example, rubbing alignment films, and the anchoring strength can be specified to a desirable range by changing rubbing strength. The weak anchoring alignment film 44 is an alignment film with a lower anchoring energy than the strong anchoring alignment film 45.

In the first stable state, the liquid crystal molecules 22A are homogeneously aligned between the weak anchoring alignment film 44 disposed on the first substrate 100 side and the strong anchoring alignment film 45 disposed on the second substrate 200 side as shown in FIG. 16. At this stage, by applying the pulsed voltage shown in FIG. 17 across the pixel electrode 21 on the first substrate 100 side and the opposite electrode 23 on the second substrate 200 side, the liquid crystal molecules 22A on the first substrate 100 side are released from anchoring and rotated by 180° from the first stable state in a plan view. In contrast, the alignment direction of the liquid crystal molecules 22A on the second substrate 200 side does not change. The rotation of the liquid crystal molecules 22A on the first substrate 100 side propagates toward the second substrate 200 side and rotates the liquid crystal molecules 22A. The rotated liquid crystal molecules 22A are realigned to the second stable state, assuming the twisted alignment shown in FIG. 18.

In the twisted alignment shown in FIG. 18, if the pulsed voltage shown in FIG. 19 is applied across the pixel electrode 21 and the opposite electrode 23, the liquid crystal molecules 22A on the first substrate 100 side are released from anchoring and rotated. The rotated liquid crystal molecules 22A are realigned to the first stable state, assuming the homogeneous alignment shown in FIG. 16.

Although there is a need to apply a pulsed voltage for switching between the first stable state shown in FIG. 16 and the second stable state shown in FIG. 18, there is no need to continuously apply a voltage across the pixel electrode 21 and the opposite electrode 23 to maintain the two stable states because both the first stable state and the second stable state are energetically stable states.

In the first stable state, the pretilt angle of the liquid crystal molecules 22A on the first substrate 100 side is preferably from 0° to 5°, both inclusive, the pretilt angle of the liquid crystal molecules 22A on the second substrate 200 side is preferably from 5° to 10°, both inclusive, and the alignment direction of the liquid crystal molecules 22A on the first substrate 100 side and the alignment direction of the liquid crystal molecules 22A on the second substrate 200 side preferably make an angle of from 0° to 10°, both inclusive, in a plan view. This structure enables producing a better black display.

In the second stable state, the pretilt angle of the liquid crystal molecules 22A on the first substrate 100 side is preferably from 0° to 5°, both inclusive, the pretilt angle of the liquid crystal molecules 22A on the second substrate 200 side is preferably from 5° to 10°, both inclusive, the alignment direction of the liquid crystal molecules 22A on the first substrate 100 side and the alignment direction of the liquid crystal molecules 22A on the second substrate 200 side preferably make an angle of from 0° to 10°, both inclusive, in a plan view, and the liquid crystal molecules 22A are preferably twisted in-plane by from 170° to 180°, both inclusive, from the first substrate 100 side toward the second substrate 200 side. This structure enables producing a better white display.

Embodiment 4

The present embodiment will focus on features that are unique to the present embodiment, and description of the content that is common to the present embodiment and Embodiment 1 above is omitted. The present embodiment is substantially the same as Embodiment 1, except for the structure of the reflector 21X.

Figure 20:
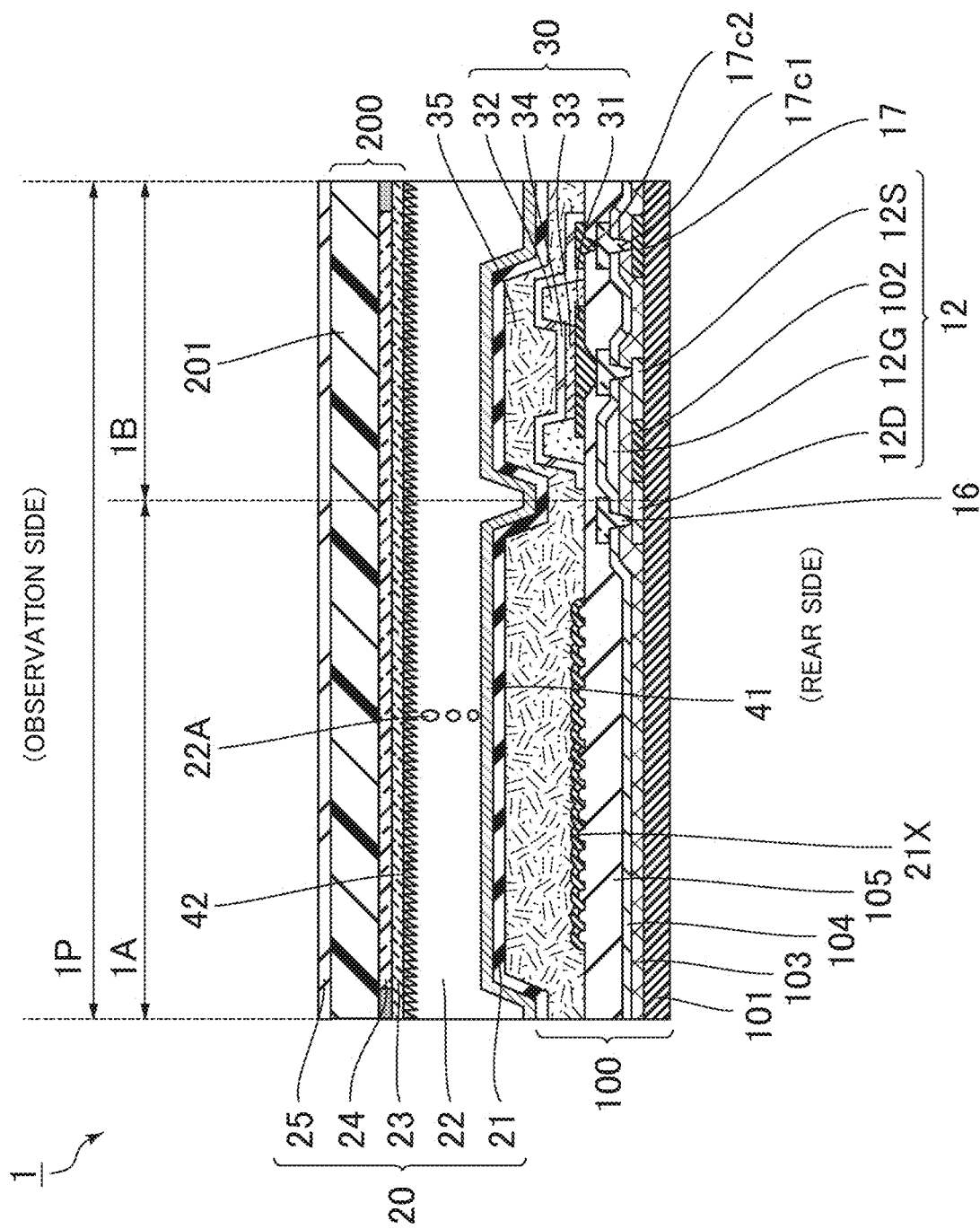
FIG. 20 is a schematic cross-sectional view of a pixel in a display device in accordance with Embodiment 4.

FIG. 20 is a schematic cross-sectional view of a pixel in a display device in accordance with Embodiment 4. Referring to FIG. 20, the reflector 21X in the display device 1 in accordance with the present embodiment has projections and depressions on a surface thereof on the liquid crystal layer 22 side. This structure diffuses reflected light in all directions, thereby improving visibility and reflectivity.

The reflector 21X has a surface structure with fine projections and depressions (MRS: micro reflective structure). The reflector 21X with the MRS shape is obtained, for example, by forming projections and depressions on the surface of the insulating film 105 on the liquid crystal layer 22 side by photolithography and forming a film of, for example, various high reflection metals such as Al and an Ag alloy. The MRS shape can scatter external light in a certain range of angles. Therefore, ambient light can be efficiently utilized, thereby producing a bright reflective display.

What is claimed is:

1. A display device comprising:
   a first substrate including a switching element;
   a liquid crystal layer containing liquid crystal molecules; and
   a second substrate including an opposite electrode, the first substrate, the liquid crystal layer and the second substrate are provided sequentially,
   the display device further comprising a plurality of pixels arranged in a matrix in a display area, wherein
      each of the plurality of pixels includes a reflective liquid crystal portion and a self-luminous element portion,
   in the reflective liquid crystal portion, the first substrate includes a reflector, a coating layer, and a pixel electrode, which are provided sequentially toward a side of the liquid crystal layer, but does not include a switching element,
   the reflector, the pixel electrode, the liquid crystal layer, and the opposite electrode form a reflective liquid crystal display element that operates in bistable liquid crystal display mode,
   in the self-luminous element portion, the first substrate includes:
      the switching element;
      a self-luminous display element including a first electrode, an organic layer, and a second electrode; and
      the coating layer disposed on a side of the liquid crystal layer of the self-luminous display element, and
      the coating layer is provided contiguously across the reflective liquid crystal portion and the self-luminous element portion.

2. The display device according to claim 1, further comprising:
   a non-display area provided around the display area; and
   a wire provided in the non-display area of the first substrate, wherein
   in the non-display area, the opposite electrode is connected to the wire, and the pixel electrode is connected to the wire.

3. The display device according to claim 1, wherein
   the liquid crystal layer assumes either one of a first stable state and a second stable state in which the liquid crystal molecules assume different alignment states in absence of applied voltage where a voltage that is lower than a threshold value is applied across the pixel electrode and the opposite electrode, and
   the liquid crystal molecules are switched between the first stable state and the second stable state by applying a pulsed voltage across the pixel electrode and the opposite electrode.

4. The display device according to claim 1, wherein the coating layer is provided contiguously across the plurality of pixels.

5. The display device according to claim 1, wherein the reflector is disposed in a same layer as the first electrode.

6. The display device according to claim 1, further comprising:
   a vertical alignment film disposed between the first substrate and the liquid crystal layer; and
   a grating layer disposed between the second substrate and the liquid crystal layer, wherein
   the liquid crystal layer assumes either one of a first stable state in which the liquid crystal molecules assume a vertical alignment and a second stable state in which the liquid crystal molecules assume an HAN alignment in absence of applied voltage where a voltage that is lower than a threshold value is applied across the pixel electrode and the opposite electrode, and
   the liquid crystal molecules are switched between the first stable state and the second stable state by applying a pulsed voltage across the pixel electrode and the opposite electrode.

7. The display device according to claim 6, wherein in the first stable state, the liquid crystal molecules have a pretilt angle of from 85° to 90°, both inclusive, on a side of the first substrate and a pretilt angle of from 85° to 90°, both inclusive, on a side of the second substrate.

8. The display device according to claim 6, wherein in the second stable state, the liquid crystal molecules have a pretilt angle of from 85° to 90°, both inclusive, on a side of the first substrate and a pretilt angle of from 0° to 5°, both inclusive, on a side of the second substrate.

9. The display device according to claim 1, further comprising:
   a pretilted horizontal alignment film disposed between the first substrate and the liquid crystal layer; and
   a grating layer disposed between the second substrate and the liquid crystal layer, wherein
   the liquid crystal layer assumes either one of a first stable state in which the liquid crystal molecules assume a TN alignment and a second stable state in which the liquid crystal molecules assume an HAN alignment in absence of applied voltage where a voltage that is lower than a threshold value is applied across the pixel electrode and the opposite electrode, and
   the liquid crystal molecules are switched between the first stable state and the second stable state by applying a pulsed voltage across the pixel electrode and the opposite electrode.

10. The display device according to claim 9, wherein
    in the first stable state, the liquid crystal molecules have a pretilt angle of from 3° to 5°, both inclusive, on a side of the first substrate and a pretilt angle of from 0° to 5°, both inclusive, on a side of the second substrate, and
    an alignment direction of the liquid crystal molecules on the side of the first substrate and an alignment direction of the liquid crystal molecules on the side of the second substrate make an angle of from 80° to 90°, both inclusive, in a plan view.

11. The display device according to claim 9, wherein in the second stable state, the liquid crystal molecules have a pretilt angle of from 3° to 5°, both inclusive, on a side of the first substrate and a pretilt angle of from 85° to 90°, both inclusive, on a side of the second substrate.

12. The display device according to claim 1, further comprising:
a weak anchoring alignment film disposed between the first substrate and the liquid crystal layer; and
a strong anchoring alignment film disposed between the second substrate and the liquid crystal layer, wherein
the liquid crystal layer assumes either one of a first stable state in which the liquid crystal molecules assume a homogeneous alignment and a second stable state in which the liquid crystal molecules on a side of the first substrate assume a twisted alignment in which these liquid crystal molecules are twisted by 180° from the first stable state in a plan view, in absence of applied voltage where a voltage that is lower than a threshold value is applied across the pixel electrode and the opposite electrode, and
the liquid crystal molecules are switched between the first stable state and the second stable state by applying a pulsed voltage across the pixel electrode and the opposite electrode.

13. The display device according to claim 12, wherein
in the first stable state, the liquid crystal molecules have a pretilt angle of from 0° to 5°, both inclusive, on the first substrate and a pretilt angle of from 5° to 10°, both inclusive, on a side of the second substrate, and
an alignment direction of the liquid crystal molecules on the side of the first substrate and an alignment direction of the liquid crystal molecules on the side of the second substrate make an angle of from 0° to 10°, both inclusive, in a plan view.

14. The display device according to claim 12, wherein
in the second stable state, the liquid crystal molecules have a pretilt angle of from 0° to 5°, both inclusive, on the side of the first substrate and a pretilt angle of from 5° to 10°, both inclusive, on a side of the second substrate,
an alignment direction of the liquid crystal molecules on the side of the first substrate and an alignment direction of the liquid crystal molecules on the side of the second substrate make an angle of from 0° to 10°, both inclusive, in a plan view, and
the liquid crystal molecules are aligned twisted in-plane by from 170° to 180°, both inclusive, from the side of the first substrate toward the second substrate.

15. The display device according to claim 1, wherein the reflector has projections and depressions on a surface of the reflector on a side of the liquid crystal layer.

* * * * *